(12) United States Patent
Gazneli et al.

(10) Patent No.: US 10,177,719 B2
(45) Date of Patent: Jan. 8, 2019

(54) METHODS AND DEVICES FOR PREDISTORTION OF SIGNALS

(71) Applicant: Intel IP Corporation, Santa Clara, CA (US)

(72) Inventors: Avi Gazneli, Rehovot (IL); Michael Kerner, Tel Mond (IL); Amir Rubin, Kiryat Ono (IL); Itay Almog, Ganey Tikva (IL); Avi Sulimarski, Kfar Oranim (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/584,076

(22) Filed: May 2, 2017

(65) Prior Publication Data

US 2017/0353163 A1 Dec. 7, 2017

(30) Foreign Application Priority Data

Jun. 1, 2016 (EP) ..................................... 16172440

(51) Int. Cl.
| | | |
|---|---|---|
| *H03F 1/32* | (2006.01) | |
| *H03F 3/20* | (2006.01) | |
| *H03F 1/30* | (2006.01) | |
| *H03F 3/195* | (2006.01) | |
| *H03F 3/24* | (2006.01) | |

(52) U.S. Cl.
CPC ............ *H03F 1/3247* (2013.01); *H03F 1/30* (2013.01); *H03F 1/3258* (2013.01); *H03F 3/195* (2013.01); *H03F 3/20* (2013.01); *H03F 3/245* (2013.01); *H03F 2200/102* (2013.01); *H03F 2200/105* (2013.01); *H03F 2200/294* (2013.01); *H03F 2200/447* (2013.01); *H03F 2200/465* (2013.01); *H03F 2200/468* (2013.01); *H03F 2201/3224* (2013.01); *H03F 2201/3233* (2013.01)

(58) Field of Classification Search
CPC ..................................................... H03F 1/3241
USPC ........................................... 330/149; 375/297
See application file for complete search history.

(56) References Cited

U.S. PATENT DOCUMENTS

| | | | |
|---|---|---|---|
| 5,524,285 A | 6/1996 | Wray et al. | |
| 6,342,810 B1 * | 1/2002 | Wright .................. | H03F 1/3241 330/124 D |

(Continued)

FOREIGN PATENT DOCUMENTS

GB        2293509 A        11/2014

OTHER PUBLICATIONS

Dennis R. Morgan et al; "A Generalized Memory Polynomial Model for Digital Predistortion of RF Power Amplifiers"; IEEE Transactions on Signal Processing, vol. 54, No. 10, Oct. 2006.

*Primary Examiner* — Henry Choe
(74) *Attorney, Agent, or Firm* — 2SPL Patentanwaelte PartG mbB; Mani Arabi

(57) ABSTRACT

A method for predistorting an input signal of an amplifier device comprises evaluating a selection criterion for a computational model of the amplifier device. The computational model provides an output signal of the amplifier device for the input signal of the amplifier device. Further, the method comprises selecting between a first computational model of the amplifier device and a second computational model of the amplifier device based on the evaluated selection criterion. Additionally, the method comprises predistorting the input signal of the amplifier device using the selected computational model.

20 Claims, 6 Drawing Sheets

(56) References Cited

U.S. PATENT DOCUMENTS

| | | | |
|---|---|---|---|
| 7,336,725 B2* | 2/2008 | Cova | H03F 1/3258 375/296 |
| 2006/0229036 A1 | 10/2006 | Muller et al. | |
| 2009/0088093 A1 | 4/2009 | Nentwig | |
| 2011/0270590 A1* | 11/2011 | Aparin | G06K 9/00496 703/2 |
| 2014/0333376 A1 | 10/2014 | Hammi | |

* cited by examiner

METHODS AND DEVICES FOR PREDISTORTION OF SIGNALS

TECHNICAL FIELD

The present disclosure relates to predistortion concepts for telecommunication signals.

BACKGROUND

Numerous telecommunication devices, such as wireless local area network transceivers, mobile phones, base stations, radio equipment, radar systems, and the like, rely on predistortion to compensate signal distortions. Signal distortions become often more severe as data rate and bandwidth increase, causing more stringent requirements for predistortion performance that are frequently met by more elaborate and complex predistortion concepts, which on the other hand often come at cost of higher computational effort. Hence, it is desired to improve the efficiency of predistortion concepts.

BRIEF DESCRIPTION OF THE FIGURES

Some examples of methods and/or apparatuses will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including,"when used herein, specify the presence of stated features, integers, steps, operations, elements and/or component signals, but do not preclude the presence or addition of one or more other features, integers, steps, operations, elements, component signals and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
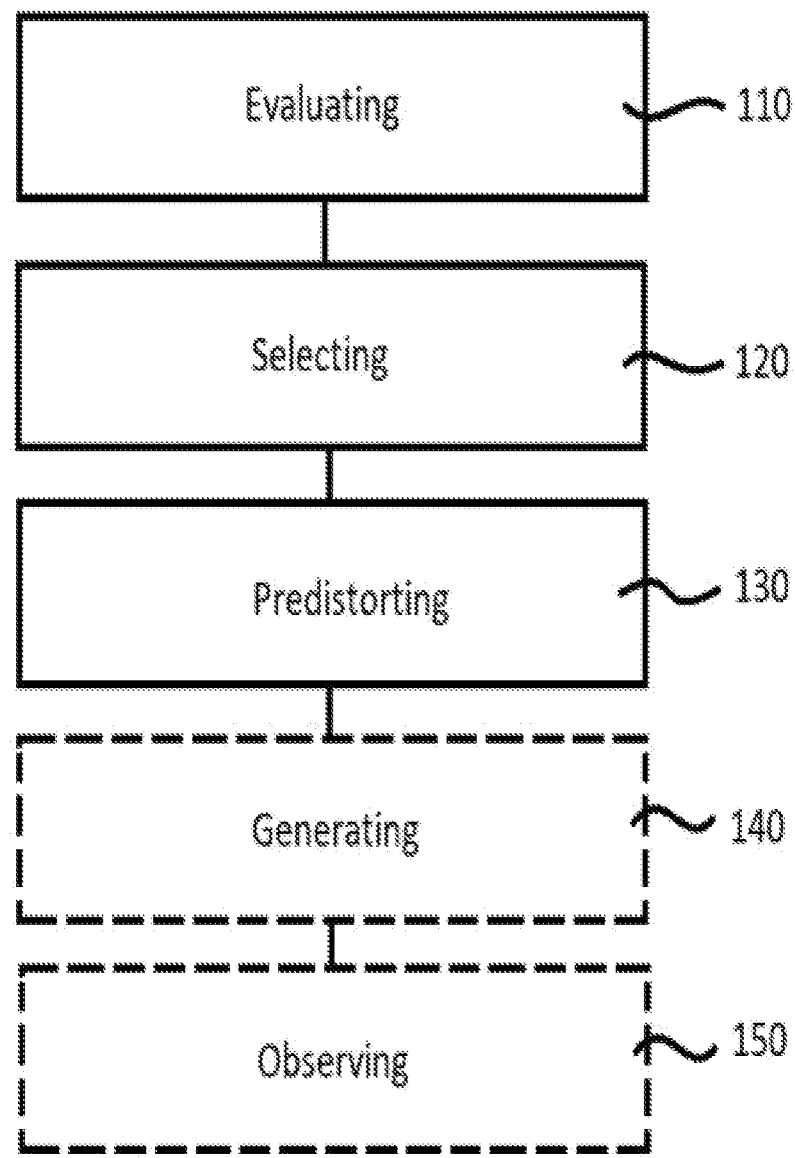
FIG. 1 shows a flow chart of a method for predistorting a signal.

FIG. 1 shows a flow chart of a method for predistorting an input signal of an amplifier device according to an example. The method 100 comprises evaluating 110 a selection criterion for a computational model of the amplifier device. The computational model provides an output signal of the amplifier device for the input signal of the amplifier device. Further, the method 100 comprises selecting 120 between a first computational model of the amplifier device and a second computational model of the amplifier device based on the evaluated selection criterion. Additionally, the method 100 comprises predistorting 130 the input signal of the amplifier device using the selected computational model. The method 100 may optionally comprise generating 140 a set of coefficients for the selected computational model. The method 100 may also optionally comprise observing 150 a trigger condition and at least one of reevaluating the selection criterion and/or generating the set of coefficients for the selected computational model on occurrence of the trigger condition.

By selecting 120 between different computational models (e.g., the first or the second computational model) of the amplifier device based on the evaluated selection criterion, and by predistorting 130 the input signal of the amplifier device using the selected computational model, predistortion of the input signal may be performed more efficiently. In comparison to other predistortion concepts, a more efficient predistortion may, for example, be faster, require less computational operations and hence less computational resources, and/or may require less electrical energy. In this way, the predistortion may be adapted to properties of the input signal, to properties of the amplifier device, and/or other conditions, such as available computing power and/or a time budget, which may define a maximum time available to provide a predistorted input signal.

Often amplifier devices, like signal amplifiers, analog and/or mixed-signal signal processing circuits, have imperfect transfer characteristics, e.g., in addition to processing a signal according to their functionality, they also distort the processed signal and provide an output signal that is distorted with respect to the corresponding input signal. A computational model of the amplifier device (e.g., the signal amplifier, the analog and/or the mixed-signal signal processing circuit) may be defined that provides the output signal of the amplifier device for the input signal of the amplifier device. The computational model may be in form of a mathematical function (e.g., an equation), whose function arguments may correspond to the input signal and whose function values may correspond to the output signal. The computational model may be used to compute the output signal based on the input signal and hence also to compute (e.g., predict) the distortions of the output signal. By being able to compute (e.g., predict) the distortions of the output signal of the amplifier device, the input signal can be predistorted, e.g., inverted with respect to the distortions. The input signal may then be provided as a predistorted input signal to the amplifier device, such that the output signal of the amplifier device may be undistorted or less severely distorted with respect to the input signal.

Based on the evaluated selection criterion, the computational model of the amplifier device may be dynamically selected during processing of the input signal, e.g., during operation of the amplifier device, according to some embodiments.

In some examples, the amplifier device may comprise a signal amplifier. In some examples, the signal amplifier may comprise an amplifier circuit. The amplifier circuit may, for example, be a power amplifier, e.g., an output stage of a transmitter circuit, which amplifies radio frequency (RF) signals, such as a modulated or unmodulated carrier. Predistorting the input signal of a signal amplifier may help to circumvent, e.g., to compensate, nonlinear distortions and/or distortions due to high frequency effects, such as memory effects, added by the signal amplifier to the input signal. Nonlinear distortions may occur during the operation of power amplifiers, as power amplifiers are often driven into saturation to deliver a high output power (e.g., their maximum output power).

In some examples, the signal amplifier comprises a plurality of amplifiers, for example, a driver amplifier connected in series to a power amplifier as an output stage, wherein the driver amplifier (and/or the power amplifier) may be a variable gain amplifier.

According to yet another example, the signal amplifier may comprise an analog signal processing chain, e.g., an analog frontend, comprising mixer circuitry, local oscillator circuitry, matching circuitry, attenuation circuitry, filter circuitry, and/or amplifier circuitry. In an example, the input signal enters the signal amplifier at an intermediate frequency (IF) and is up-converted to an RF by a mixer circuit. On the RF, the up-converted input signal may be filtered by a filter circuit and be amplified by a power amplifier. A computational model of the analog signal processing chain (e.g., the signal amplifier) may then consider an entirety of the nonlinearities and high frequency effects of the analog signal processing chain's individual components. The computational model may thus help to reduce distortions of the output signal of the analog signal processing chain without having to consider (e.g., model) each individual component separately.

In some examples, the amplifier device may be a mixed-signal circuit, e.g., a mixed-signal integrated circuit (IC), which comprises digital signal processing circuitry and a signal amplifier (e.g., analog signal processing circuitry). The digital processing circuitry comprised by the amplifier device may comprise digital signal processor (DSP) circuitry, which may, for instance, implement a software defined radio, digital filters, and/or a numerically controlled oscillator (NCO). The signal amplifier (e.g., the analog signal processing circuitry) comprised by the amplifier device may comprise mixer circuitry, local oscillator circuitry, matching circuitry, attenuation circuitry, filter circuitry, and/or amplifier circuitry. Moreover, the mixed-signal circuit may comprise digital-to-analog converter (DAC) circuitry and/or analog-to-digital converter (ADC) circuitry. The input signal of the mixed-signal circuit may be a digital signal. When using a computational model for predistorting an input signal of an amplifier device, the input signal is often sampled (e.g., digitized) to compute the predistorted input signal, for example, using a nonlinear digital filter. The input signal of a mixed-signal circuit may, however, be already in digital form, such that an additional sampling of the input signal can be saved, which in turn can reduce hardware effort and reduce electric power consumption.

Examples of the present disclosure may use computational models of an amplifier device for predistorting 130 input signals of the amplifier device. Different computational models may have different complexities. The complexity of a computational model may, for instance, correspond to a number of computational operations (e.g., additions, subtractions, multiplications, and/or divisions), which are carried out in order to compute the output signal of the amplifier device based on the input signal of the amplifier device. The complexity of the computational model may also correspond to a number of coefficients (e.g., non-zero coefficients) of the computational model. Moreover, the complexity of the computational model may correspond to a number of filter taps of a nonlinear digital filter, the nonlinear digital filter implementing the computational model or an inverse (e.g., an inverse function) of the computational model. Further, the complexity of the computational model may also correspond to a computing time needed by a computing circuit, e.g., a control subcircuit, to compute the output signal of the amplifier device and/or a predistorted input signal for the amplifier device based on the input signal (e.g., the undistorted input signal) of the amplifier device. Additionally or alternatively, the complexity of the computational model may correspond to a number of computational operations needed for computing coefficients of the computational model.

Often it is found, the higher the complexity of the computational model, the higher also the accuracy of the computational model, e.g., the difference between the computed output signal and the actual output signal becomes smaller when the computational model has a higher complexity. In other words, a performance of predistortion may improve as the complexity of the computational model is increased. For example, the number of coefficients of the computational model (e.g., a predistortion model for mitigating real impairments of a transmission chain), may be increased. The performance of predistortion may be expressed by performance parameters used in telecommunication engineering. For instance, the lower an error-vector-magnitude (EVM), or the higher an adjacent channel power ratio (ACPR), or the lower a symbol error rate (SER), or the lower a bit error rate (BER) of the output signal of the amplifier device, the higher the quality of the output signal, and hence the higher also the performance of predistortion applied to the corresponding input signal of the amplifier device. In here, the ACPR is understood as the ratio of the average power of the output signal in a main frequency channel (e.g., the frequency channel dedicated to the output signal) to the average power of the output signal in an adjacent frequency channel, e.g., a frequency channel neighboring the main frequency channel, whose center frequency is either lower or higher than the center frequency of the main frequency channel.

In some examples of the present disclosure, the first computational model of the amplifier device may have a higher complexity than the second computational model of the amplifier device. Hence, the first computational model or the second computational model may be selected according to the selection criterion, which in some examples depends on an available computing power and/or on a time budget available for computing the coefficients of the computational model and/or for computing the predistorted input signal of the amplifier device. For example, if with the available computing power the available time budget is sufficient for computing the coefficients of the first computational model and/or for computing the predistorted input signal with the first computational model, the first computational model may be selected and used to predistort the input signal of the amplifier device. If however, for example, with the available computing power the available time budget would be exceeded for computing the coefficients of the first computational model and/or for computing the predistorted input signal with the first computational model, but is sufficient for computing the coefficients of the second computational model and/or for computing the predistorted input signal with the second computational model, the second computational model may be selected and used to predistort the input signal.

Herein, available computing power may be understood as a number of computational operations (e.g., additions, subtractions, multiplications, and/or divisions) that can be performed within a unit time. The computational operations may, for example, be performed by a processor circuit, like a central computing unit or a digital signal processor, which may be implemented by an integrated circuit, an application specific integrated circuit, a field programmable gate array (FPGA), a microcontroller, and/or a complex programmable logic device (CPLD). Available computing power, for example, of a processor circuit, may vary over time and depend on a utilization of the processor circuit due to other tasks.

In some examples, the method 100 may further comprise generating a set of coefficients for the selected computational model. As already explained above, the computational model provides the output signal of the amplifier device for the corresponding input signal of the amplifier device, for example, in form of a mathematical function. The computational model may, for instance, be in form of a polynomial or a transcendental function, e.g. an exponential function, a logarithmic function, and/or a trigonometric function, with a certain amount of coefficients (e.g., a set of coefficients). The values of the coefficients may be determined (e.g., computed) to apply the computational model to a particular realization of the amplifier device in a particular state. That is to say, for a particular realization of the amplifier device, the coefficients of the computational model may be different (e.g., may have different values) than for another particular realization of the same amplifier device. Moreover, for the same realization of the amplifier device, the coefficients of the computational model may be different for different properties and/or different settings of the amplifier device, e.g., for different temperatures, different supply voltages, and/or different signal path settings. Different signal path settings may, for example, comprise different gains, different maximum output powers, different oscillator frequencies, different intermediate frequencies, different radio frequencies, and/or different signal paths.

Generating a set of coefficients for the selected computational model may comprise recording (e.g., sampling) the output signal (e.g., a portion of the output signal) and optionally recording the corresponding input signal (e.g., a portion of the input signal) of the amplifier device. In some examples, the input signal is already known and does not have to be recorded. According to the selected computational model a systems of equations may be set up. In the systems of equations the recorded output signal may depend on the input signal (e.g., the recorded input signal). The unknowns of the system of equations may be the coefficients of the selected computational model. Hence, solving the system of equations may yield, e.g., generate, the set of coefficients for the selected computational model.

In some examples, the system of equations may be an overdetermined system, e.g., the number of coefficients may be smaller than the number of independent equations (e.g., equations which are not multiples or not linear combinations of each other). For example, by recording the output signal and, if required, also the input signal for a longer period of time, more equations may be added to the system of equations. The coefficients of the computational model may approximately satisfy the overdetermined system of equations, e.g., in a least squares sense, such that the differences (e.g., the sum of the squared absolute values of the differences) between the recorded samples of the output signal and corresponding samples of an output signal computed from the computational model using the coefficients are minimized. In this way, a set of coefficients of the selected computational model may be determined (e.g., generated), such that on average the output signal may most accurately be computed (e.g., predicted) based on the input signal using the selected computational model.

In some examples, the system of equations may have a unique solution for the coefficients of the computational model.

According to some examples of the present disclosure, an example of the first computational model is given by Equation 1 and an example of the second computational model is given by Equation 2:

$$y[n] = \sum_{k=1}^{5} p_k \cdot x[n] \cdot |x[n]|^{k-1} + \sum_{k=1}^{5} \sum_{q=1}^{5} p_{1,kq} \cdot x[n-q] \cdot |x[n-q]|^{k-1} \quad \text{Equation 1}$$

$$y[n] = \sum_{k=1}^{5} p_k \cdot x[n] \cdot |x[n]|^{k-1} \quad \text{Equation 2}$$

In Equation 1 and in Equation 2, x[n] denotes the input signal of the amplifier device and y[n] denotes the corresponding output signal of the amplifier device. n is a sampling point (e.g., a point in time, where the input signal and/or the output signal is sampled) and q is a shift (e.g., a time shift) from the sampling point n. Moreover, the first computational model according to Equation 1 comprises a first set of coefficients $p_k$ and $p_{1,kq}$, whereas the second computational model according to Equation 2 comprises a second set of coefficients $p_k$. The coefficients of the first computational model and the coefficients of the second computational model may be complex numbers, e.g., having a real part and an imaginary part.

In this example, the first set of coefficients of the first computational model comprises a total number of 30 coefficients (e.g., complex coefficients), whereas the second set of coefficients of the second computational model comprises a total number of 5 coefficients (e.g., complex coefficients). Hence, in this example the first computational model has a higher complexity than the second computational model. Furthermore, Equation 1 may be regarded as a general model, which may be simplified to Equation 2 (e.g., a nonlinear only model) by nullifying (e.g., setting equal to zero) the coefficients $p_{1,kq}$.

In some examples, generating a first set of coefficients for the first computational model may require a higher computational effort than generating a second set of coefficients for the second computational model. The computational effort may, for example, correspond to a number of computational operations (e.g., additions, subtractions, multiplications, and/or divisions) or to a computational time for a given computing power, which is necessary to generate a set of coefficients. Moreover, the computational effort may, for instance, also correspond to a number of equations, which contain the coefficients as unknowns and which may be solve to determine the coefficients (e.g., the values of the coefficients). For a certain performance of predistortion, e.g., a certain maximal EVM, maximal SER, maximal BER and/or minimal ACPR of the output signal, some computational models may require a longer recording time, e.g., more samples, of the output signal and, if required, of the input signal to generate the coefficients, leading to a higher number of equations and thus to a higher computational effort.

As in some examples the selection criterion depends on an available computing power and/or on a time budget available for computing the coefficients of the computational model, the first computational model or the second computational model may be selected accordingly. For example, if with the available computing power the available time budget is sufficient to compute the coefficients of the first computational model, the first computational model may be selected and used to predistort the input signal of the amplifier device. If however, for example, with the available computing power the available time budget would be exceeded for computing the coefficients of the first computational model, but is sufficient for computing the coefficients of the second computational model, the second computational model may be selected and used for predistorting 130 the input signal.

Moreover, according to some examples, the input data, e.g., the sampled output signal and, if needed, the sampled input signal, for generating the coefficients of the first computational model and for generating the coefficients of the second computational model is available. However, one computational model may be selected over the other because of an available computing power and an available time budget. In other words, the second computational model may be selected instead of the first computational model if the processing latency for generating the coefficients of the first computational model is too long, e.g., exceeds the available time budget.

In some examples, the first computational model and/or the second computational model of the amplifier device may provide the output signal of the amplifier device, wherein the output signal depends nonlinearly on the corresponding input signal of the amplifier device. For example, both the first computational model according to Equation 1 and the second computational model according to Equation 2 provide the output signal y[n] depending nonlinearly on the input signal x[n]. A nonlinear dependency of the output signal and the input signal, e.g. a nonlinear computational model, may, for example, be used to include a large signal response of the amplifier device in the computational model. For example, a saturation of an amplifier, a mixing process of mixer circuit, a filter response of a tunable filter using, for instance, varactor diodes, a diode characteristic, and/or other compression effects of electronic devices may be described by their large signal response. Including a large signal response may support modeling the distortions, e.g., nonlinear distortions, of the amplifier device.

In some examples, the first computational model may provide the output signal of the amplifier device, wherein the output signal depends on a present portion and on a preceding portion of the corresponding input signal. Herein, a portion of a signal may refer to a sampling point (or a plurality of sampling points) together with a corresponding sampling value (or a plurality of corresponding sampling values) of the signal. Hence, the first computational model may provide the output signal depending on the input signal at the same sampling point, e.g., the same instance of time, and also depending on the input signal at a preceding sampling point (or at preceding samplings points), e.g., at a preceding time instance (or at preceding time instances). For example, the first computational model according to Equation 1 provides the output signal y[n] depending on a present portion x[n] of the input signal and also depending on a preceding portion x[n−q] (q>0) of the input signal.

In some examples, the first computational model may provide the output signal of the amplifier device depending nonlinearly on a present portion and/or also depending nonlinearly on a preceding portion of the corresponding input signal. For example, the first computational model according to Equation 1 provides the output signal y[n] depending nonlinearly on a present portion x[n] of the input signal and also depending nonlinearly on a preceding portion x[n−q] (q>0) of the input signal.

In some examples, a computational model, e.g., the first computational model, which provides the output signal depending on a present portion and on a preceding portion of the corresponding input signal, may be used to describe and include a high frequency response (e.g., a high frequency behavior) of the amplifier device. That is to say, such computational models may cover high frequency effects, such as memory effects. Memory effects of an active semiconductor device and/or of biasing circuitry, which is comprised by the amplifier device, may, for example, include storage effects of minority charge carriers, transport delay and/or rapid thermal time constants.

As, according to some examples, the selection criterion for selecting 120 a computational model depends on a property of the input signal, for example, the bandwidth of the input signal, the first computational model, which provides the output signal depending on a present portion and on a preceding portion of the corresponding input signal, may be used for predistorting 130 the input signal, if the bandwidth of the input signal is larger than a predefined bandwidth. The predefined bandwidth may, for example, amount to a value between 40 MHz and 80 MHz, between 80 MHz and 160 MHz, or, in some examples, to a value above 160 MHz, or above 2000 MHz. The predefined bandwidth, above which the first computational model is used for predistorting 130 the input signal, may also be expressed as a bandwidth of the input signal relative to the carrier frequency (e.g., center frequency) of the input signal (or of the output signal). For example, the first computational model may be used for predistorting 130 the input signal, if the relative bandwidth is larger than 0.8%, larger than 1.6%, larger than 3.2%, or even as large or larger than 5%. For equal or smaller bandwidths than the predefined bandwidth, the second computational model, that provides the output signal depending nonlinearly on a present portion of the input signal only, may be selected for predistorting 130 the input signal.

In some examples, the first computational model may comprise a first polynomial and the second computational model may comprise a second polynomial, wherein the first polynomial comprises more coefficients (e.g., more non-zero coefficients) than the second polynomial. For example, the first computational model according to Equation 1 is a polynomial, e.g. a first polynomial, with 30 complex coefficients. The second computational model according to Equation 2 is a polynomial, e.g. a second polynomial, with 5 complex coefficients. Hence, the first polynomial according to Equation 1 comprises more coefficients than the second polynomial according to Equation 2. Computational models comprising polynomials or in form of polynomials may have a higher complexity, if they comprise more coefficients (e.g., more non-zero coefficients), and may also require a higher computational effort to compute the values of the larger amount of coefficients.

In some examples, the first computational model and the second computational model may both comprise polynomials, which provide the output signal depending both nonlinearly on a present portion and depending nonlinearly on a preceding portion of the corresponding input signal. However, the first computational model, e.g., the first polynomial, may comprise more coefficients than the second computational model, e.g. the second polynomial. Thus, the coefficients of the second polynomial may be generated faster than the coefficients of the first polynomial, whereas the first polynomial may provide a higher quality of the output signal than the second polynomial. Hence, according to the selection criterion, the first polynomial may be selected if a high quality of the output signal is needed. For example, an output signal may be needed that has a ACPR higher than a predefined value, e.g., that causes an out-of-band noise lower than a predefined boundary, in order not to interfere with signals of adjacent channels. Consequently, the input signal of the amplifier device may be predistorted using the first polynomial.

If however, requirements of the output signal quality are less stringent, the second polynomial may be used for predistorting 130 the input signal of the amplifier device. Less stringent requirements may, for example, be given during the beginning of a transmission. In the beginning of the transmission, the input signal (and thus the output signal) may have a lower bandwidth and may thus not cause interference in adjacent channels as the channel bandwidth may be wider than the bandwidth of the output signal. For example, in a telecommunication according to the telecommunication standard IEEE 802.11, e.g., IEEE 802.11n, IEEE 802.11ac, and/or IEEE 802.11ad, upon creating a new connection and exchanging only control messages in legacy rates, the second computational model (e.g., the second polynomial) may be employed for predistorting 130 the input signal of the amplifier device. When transmitting a signal, e.g., the input signal, in legacy rates, the bandwidth of the signal may be much smaller than the channel bandwidth. After having created the connection, payload data may be transmitted at a rate higher than legacy rates, such that the bandwidth of the input signal is increased. The bandwidth of the input signal may, for example, be as wide as the channel bandwidth. As nonlinearities and high frequency effects of the amplifier device may now cause in-band and out-of-band distortions, the first computational model (e.g., the first polynomial) may be used for predistorting the input signal to provide a quality of the output signal required by the telecommunication standard.

In some examples, the selection criterion for selecting 120 the computational model may depend on a property of the input signal and/or on a property of the amplifier device. Moreover, in some examples, the property of the input signal may be the power of the input signal, a power dynamic range of the input signal, a carrier frequency of the input signal, a bandwidth of the input signal, and/or a modulation of the input signal.

For example, if the power of the input signal of the amplifier device may be a higher than a predefined value, the amplifier device is driven more into saturation by the input signal, causing stronger distortions, e.g., nonlinear distortions, of the output signal. Consequently, a computational model having a higher complexity, e.g., the first computational model, than another computational model, e.g., the second computational model, may be employed for predistorting 130 the input signal. The predefined value of the input power, that should be exceeded by the input signal, may, for example, be defined with respect to the input power 1 dB-compression point or with respect to the input third order intercept point of the amplifier device. In some examples, if the input power of the amplifier device exceeds a power higher than a back-off of 30 decibel (dB) below the input power 1 dB-compression point of the amplifier device, the first computational model, having a higher complexity than the second computational model, may be selected for predistorting 130 the input signal. In some examples, the back-off from the input power 1 dB-compression point may be smaller than 30 dB, for example, smaller than 20 dB, smaller than 10 dB, or even smaller than 5 dB.

The skilled person having benefit from the present disclosure will appreciate that also other properties (e.g., the power dynamic range, the carrier frequency, the bandwidth, and/or the modulation) of the input signal may be evaluated, e.g., be comprised by the selection criterion, to decide, whether a computational model with a higher complexity (e.g., the first computational model) or a computational model with a lower complexity (e.g., the second computational model) is selected for predistorting 130 the input signal of the amplifier device.

In some examples, if a modulation of the input signal is such that, the envelope of input signal is constant, for example a 4-Quadrature-Amplitude-Modulation (QAM) or a phase-shift-keying (PSK) modulation, the second computational model with a lower complexity may be selected. If the modulation of the input signal has a format, which causes a varying envelope of the input signal, e.g., a modulation of a higher format, or is changed to such a format, for example a 16-QAM, a 64-QAM, or a 256-QAM, the first computational model with a higher complexity may be selected.

In some examples, the selection criterion for selecting 120 the computational model may depend on a property of the amplifier device. Furthermore, in some examples, the property of the amplifier device is a supply voltage, a gain (e.g., a signal gain by which the output signal is amplified with respected to the corresponding input signal), a maximum output power, and/or a frequency of an oscillator.

Herein, the supply voltage may be a supply voltage of a signal amplifier (e.g., an amplifier circuit, an active mixer, an active filter, and/or an active frequency multiplier) comprised by the amplifier device. The supply voltage may be variable. The gain may be a signal gain by which the output signal is amplified with respected to the corresponding input signal and may be variable, for example, if the amplifier device comprises variable gain amplifiers and/or configurable, e.g., variable, attenuators. The oscillator may be comprised by the amplifier device and may be a local oscillator that is used to convert the input signal to another frequency domain, for example, into an RF carrier frequency domain, into an IF domain, or into a baseband frequency domain.

In some examples, the supply voltage may be adjustable or may be monitored (e.g. sensed with an ADC) as it may decrease over time, for example, if the amplifier device is battery powered. Adjusting the supply voltage (or a decrease of the supply voltage) may alter the maximum output power (e.g., the maximum power of the output signal) of the amplifier device. Often it is found, the lower the supply voltage, the lower also the maximum output power. Hence, if, according to some examples, the supply voltage is decreased from its nominal value below a predefined value, the amplifier device may be driven earlier (e.g., at lower input power) into saturation by the input signal, resulting in stronger distortions of the output signal. Consequently, a computational model with a higher complexity (e.g., the first computational model) may be selected for predistorting 130 the input signal to compensate for the stronger distortions due to the decreased supply voltage. If the supply voltage is above the predefined value, a computational model with a lower complexity (e.g., the second computational model) may be selected, according to some examples. The predefined value, below which the supply voltage may be decreased, leading to a selection of a computational model with a higher complexity, may, in some examples, amount to a value lower than 90% of the nominal supply voltage, lower than 80%, or, in at least some examples, even low than 60%.

In some examples, the input signal of the amplifier device may be up-converted to an RF carrier frequency domain using a mixer circuit together with a local oscillator. For example, the corresponding output signal of the amplifier device may be an RF carrier modulated by the input signal, wherein the carrier frequency depends on the oscillator frequency. Changing the oscillator frequency may also change the carrier frequency of the output signal. Thus, according to different oscillator frequencies the distortions of the output signal may be different, e.g., the quality of the output signal may differ for different oscillator frequencies. For example, for a higher oscillator frequency the distortions of the output signal may be stronger due to stronger high frequency effects than for a lower oscillator frequency, such that, when the local oscillator of the amplifier device is set to a higher oscillator frequency, a computational model with a higher complexity, e.g., the first computational model, may be selected to predistort the input signal.

In some examples, the method 100 further comprises observing a trigger condition. Upon occurrence (e.g., fulfillment) of the trigger condition, the selection criterion may be reevaluated. If the reevaluation of the selection criterion results in a selection of a computational model, which is different to the computational model that has been used to predistort the input signal before the trigger condition occurred, the set of coefficients for the newly selected computational model may be generated. In some examples, upon occurrence of the trigger condition the set of coefficients of the computational model, which has been used to predistort the input signal before the trigger condition occurred, may be regenerated.

In some examples, the trigger condition comprises a time out, a temperature change (e.g., a temperature change of the amplifier device or an environment of the amplifier device), and/or a change of quality of the output signal.

For example, a time out may occur after a predefined countdown has reached zero. The corresponding count down time may, according to some examples, be longer than five seconds, longer than 30 seconds, longer than one minute, or even longer than five minutes. A time out triggering the reevaluation of the selection criterion and/or the generation of coefficients of the newly selected or original computational model may ensure that the choice that has originally been made of the computational model and/or the values of the coefficients of the selected computational model still hold after a certain amount of time, when, for example, properties of the input signal and/or of the amplifier device may have changed. In an example, the coefficients of the selected computational model are periodically regenerated when the countdown reaches zero in order to adapt the values of the coefficients to potential changes of properties of the input signal and/or of properties of the amplifier device.

In some examples, if a temperature change between the temperature, which was present at the amplifier device, when the coefficients of the used computational model have been generated, and the actual temperature is higher than a predefined allowed temperature deviation, the selection criterion may be reevaluated to select another computational model and/or the coefficients of the used computational model may be regenerated. In this way, a changed behavior, e.g., a change in how the output signal is distorted by the amplifier device, can be included in the computational model, which is used to predistort the input signal. The predefined allowed temperature deviation may, for example, be 0.5 Kelvin (K) or higher, 1 K or higher, 2 K or higher, or even 10 K or higher.

For example, the input signal of the amplifier device is being predistorted according to the first computational model, which has a higher complexity than the second computational model, when a temperature change higher than the predefined allowed temperature deviation is detected. Now, the selection criterion, depending on, for example, an available computing power and an available time budget, is reevaluated. Hence, there may be two options: Either the available time budget is sufficient to regenerate the coefficients of the first computational model with the available computing power or not. In the former case, the coefficients of the first computational model are regenerated, such that the temperature change is considered in the first computational model. If not, the coefficients of the second computational model may be generated, which in this example require a lower computational effort and thus a shorter computing time, and the input signal may be predistorted using the second computational model.

A temperature change may, for example, be detected by an electronic temperature sensor, that may be integrated into the amplifier device, or that may be on the same circuit board or within the same telecommunication device as the amplifier device.

In some examples, if a change (e.g., a decrease) of the quality of the output signal is observed, for example, if the quality of the output signal drops below a predefined signal quality, the selection criterion may be reevaluated to select another computational model and to generate the coefficients of the newly selected computational model, and/or the coefficients of the used computational model may be regenerated. In this way, the method 100 may react towards a degradation of the quality of the output signal.

In some examples, the quality of the output signal may be expressed by (e.g., may be determined by) the EVM, the ACPR, the SER, and/or the BER of the output signal. These quantities may, for example, be determined by a feedback receiver, which is configured to receive the output signal of the amplifier device and maybe integrated into the amplifier device. The EVM, the SER, and the BER of the output signal may be determined with reference to the known input signal. For example, symbols and/or bits contained by the output signal may be compared to corresponding symbols and/or bits contained by the input signal, in order to determine the SER or the BER of the output signal. The ACPR may be determined from power measurements of the output signal within its channel bandwidth and from measuring the power in adjacent channels within the bandwidths of these adjacent channels. For these power measurements, the feedback receiver may be employed as well together with a power detector, for example. The EVM may also be determined using the feedback receiver.

According to an example, during a transmission of a signal, the quality of the output signal drops below a predefined signal quality, wherein the corresponding input signal is predistorted using the first computational model, which has a higher complexity than the second computational model. For example, the BER may exceed a predefined limit, which may, for example, be set to a value between 0.1% and 1%, or between 1% and 2%, or between 2% and 5%. Because the quality of the output signal is monitored (e.g., sensed) by a feedback receiver, the feedback receiver generates a trigger signal in reaction to recognizing the decrease in quality of the output signal. The trigger signal may then lead to a regeneration of the coefficients of the first computational model, since the actual coefficients do not any longer provide the required performance of predistortion and hence not the required quality of the output signal. The decrease of the quality of the output signal may have various reasons, such as changes in the external environment of the amplifier device, like sudden temperature changes or changes in voltage standing wave ratio (VSWR), e.g., changes in the load impedance of the amplifier device. With the regenerated set of coefficients, the predistortion may adapt to the changed conditions for the amplifier device and hence provide a higher quality, e.g., the required quality, of the output signal. In some examples, if, according to the selection criterion, the regeneration of the coefficients of the first computational model using an available computing power may exceed an available time budget for generating the coefficients, the second computational model may be selected instead. That is to say, the computational model for predistorting the input signal may be changed to the second computational model, whose coefficients may be generated within the available time budget using the available computing power.

Figure 2A:
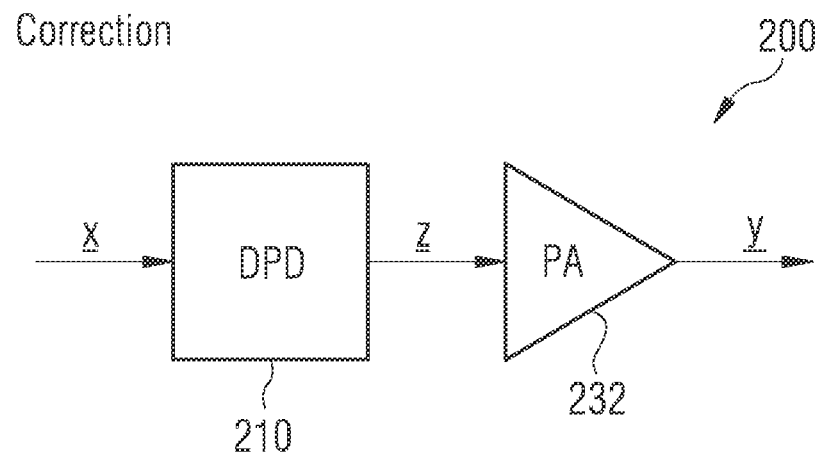
FIG. 2a shows a block diagram of a signal chain using predistortion.

FIG. 2a shows a block diagram of a signal chain 200 using predistortion, according to an example. In this example, the amplifier device comprises a power amplifier 232 with an input signal $\underline{x}$ and a corresponding output signal $\underline{y}$. Before the input signal $\underline{x}$ enters the power amplifier 232, it is predistorted by a predistortion circuit 210, e.g., a circuit employing digital predistortion. Afterwards, it is provided as a predistorted input signal $\underline{z}$ to the power amplifier. Because the input signal $\underline{x}$ is predistorted to provide an undistorted (or less distorted) output signal $\underline{y}$, the signal chain 200 is in a correction phase of operation.

The predistortion circuit 210 may, for example, employ the first computational model according to Equation 1 and/or the second computational model according to Equation 2 to predistort the input signal $\underline{x}$.

Figure 2B:
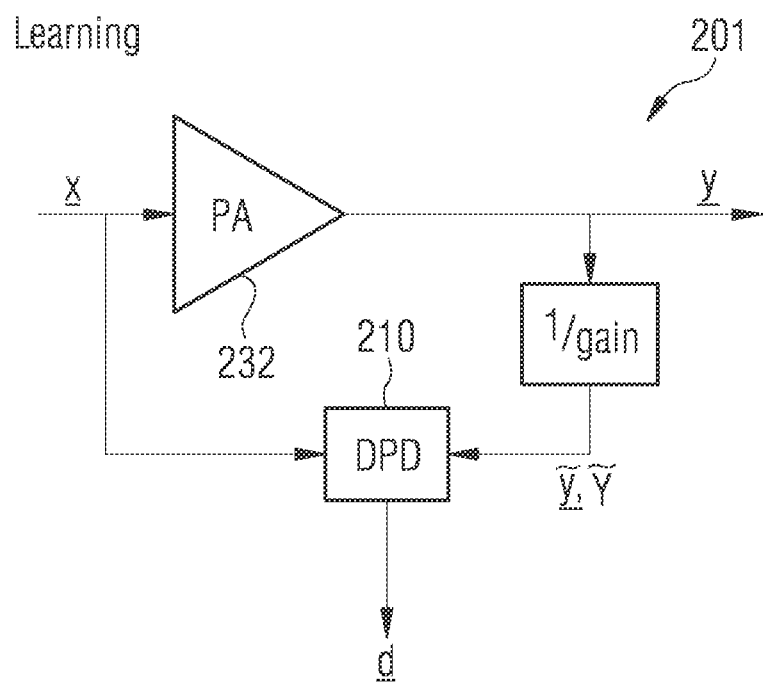
FIG. 2b shows a block diagram of a signal chain for generating coefficients of a computational model.

FIG. 2b shows a block diagram of a signal chain 201 in a learning phase of operation, e.g., for generating coefficients of a computational model, e.g., the first set of coefficients of the first computational model and/or the second set of coefficients of the second computational model. In other words, the signal chain 201 shows a setup for estimation of predistortion coefficients according to a post distortion or in-direct approach.

For the sake of clarity, it shall be amended, that in an opposed direct approach for predistorting an input signal of an amplifier device, first the coefficients of the selected computational model are generated to obtain a function, which provides the output signal of the amplifier device depending on the input signal of the amplifier device. Afterwards, according to the direct approach, this function may be inverted to an inverse function. The coefficients of this inverse function may be referred to as predistortion coefficients, as the inverse function may then be used to predistort the input signal, such that the predistorted input signal is inverted with respect to distortions caused by the amplifier device. Hence the predistorted input signal may leave the amplifier device as an undistorted (or less severely distorted) output signal. In a post distortion approach, the inverse function, e.g. the predistortion coefficients, may directly be generated. This may be accomplished by applying the computational model to compute the (known) input signal from the sampled output signal, such that the coefficients of the computational model may be identical to the predistortion coefficients. In other words, according to the post distortion approach a computational model may describe an inverted characteristic of the amplifier device.

According to FIG. 2b, the input signal $\underline{x}$ is directly fed into the amplifier device, which comprises the power amplifier 232, and is also recorded (e.g., sampled) by the predistortion circuit 210. The output signal $\underline{y}$ of the power amplifier 232 corresponding to the input signal $\underline{x}$, is divided, e.g., equalized, by the signal gain of the power amplifier 232, and also recorded (e.g., sampled) as a gain corrected output signal $\underline{\tilde{y}}$ by the predistortion circuit 210. From the gain corrected output signal $\underline{\tilde{y}}$ (e.g., sampled values of $\underline{\tilde{y}}$) a matrix $\tilde{Y}$ of size N×P may be set up, where the number N correspond to the length (e.g., the number of samples) of the input signal $\underline{x}$ and/or the output signal $\underline{y}$, and P corresponds to the number of coefficients of the selected computational model, e.g., the total number of predistortion coefficients. During the learning phase, the predistortion coefficients, which may be collected in a P×1 column vector $\underline{d}$, may then be estimated by the post distortion approach, as formulated by Equation 3:

$$\underline{d} = (\tilde{Y}^H \cdot \tilde{Y})^{-1} \cdot \tilde{Y}^H \cdot \underline{x} \qquad \text{Equation 3:}$$

In Equation 3, $\underline{x}$ is the sampled input signal (e.g., the transmitted data) collected in an N×1 column vector.

In some examples, the method 100 further comprises using a Cholesky decomposition for determining a least squares solution of a linear system of equations, wherein the linear system of equations corresponds to the selected computational model. For example, Equation 3 is the least squares solution for the predistortion coefficients $\underline{d}$ for the selected computational model of the following linear system of equations, e.g., a linear system of normal equations:

$$(\tilde{Y}^H \cdot \tilde{Y}) \cdot \underline{d} = \tilde{Y}^H \cdot \underline{x} \qquad \text{Equation 4:}$$

The solution, e.g., the predistortion coefficients $\underline{d}$, can be formally given by Equation 3. However, the predistortion coefficients $\underline{d}$ may be determined by solving Equation 4 employing a Cholesky decomposition (e.g., a Cholesky decomposition of the matrix $(\tilde{Y}^H \cdot \tilde{Y})$) and by using forward elimination and backward elimination.

In some examples, the least squares solution $\underline{d}$ for the predistortion coefficients described in Equation 3 may be used to achieve a robust solution with little implementation loss and may be computed comprising a Cholesky decomposition.

The complexity of the solution of Equation 3 may be given by two parameters, which are the length and the statistics of the input sequence and the number of parameters in the model (e.g., the selected computational model). The length and the statistics of the input sequence may correspond to the number of samples of the input signal $\underline{x}$ and the number of samples of the output signal $\underline{y}$. The number of parameters in the model (e.g., the selected computational model) may correspond to the number of coefficients of the selected computational model.

The complexity of the solution of Equation 3 will now be explained in terms of two examples, e.g., a first example and a second example:

In the first example, an input signal, for example, according to the standard IEEE 802.11ac, has a bandwidth of 160 MHz and is amplified by a Wireless-Fidelity (WiFi) internal power amplifier. In this example, the input signal is predistorted according to the first computational model of Equation 1, which has approximately 30 complex parameters (e.g., 30 complex coefficients). To determine the predistortion coefficients, the input signal is sampled with a sampling frequency of 640 MHz and for a required signal duration of approximately 25 micro-seconds (µs), for example. This results in a number of N=16,000 (sixteen-thousand) samples (=640e6*25 µs=16,000).

In the second example, the input signal has a bandwidth of 20 MHz. Such an input signal may, for instance, be employed for exchanging control messages at a legacy rate according to the standard IEEE 802.11 (e.g., IEEE 802.11ac) during creating a new telecommunication connection (e.g., during ramp up of a communication link). This input signal may be predistorted according to the second computational model of Equation 2, which has five complex parameters (e.g., five complex coefficients) to be estimated. Moreover, the input signal may be sampled with a sampling frequency of 160 MHz for a required signal duration of approximately 10 µs to determine the predistortion coefficients according to the second computational model. The required signal duration may hence be less than the above mentioned 25 µs, as the second computational model is employed which requires a lower computational effort for generating a corresponding set of coefficients. This results in a number of N=1,600 (one thousand six-hundred) samples (=160e6*10 µs=1,600).

The computational complexity of Equation 3 can be described as follows:

In a first step, the matrix-matrix-product $A=\tilde{Y}^H \cdot \tilde{Y}$ may be computed, which has a computational complexity, expressed in Big O Notation, proportional to $O(P^2 \times N)$:

$$A=\tilde{Y}^H \cdot \tilde{Y} \sim O(P^2 \times N) \qquad \text{Relation 5.1:}$$

In a second step, the matrix A of Equation 4.1 may be inverted to an inverse matrix B, which has a computational complexity proportional to $O(P^3)$:

$$B=(A)^{-1} \sim O(P^3) \qquad \text{Relation 5.2:}$$

In a third step, the matrix-vector-product $C=\tilde{Y}^H \cdot \underline{x}$ may be computed, which has a computational complexity proportional to $O(N)$:

$$C=\tilde{Y}^H \underline{x} \sim O(N) \qquad \text{Relation 5.3:}$$

In a fourth step, the matrix-vector-product $B \times C$ may be computed, which has a computational complexity proportional to $O(P^2)$:

$$B \times C \sim O(P^2) \qquad \text{Relation 5.4:}$$

As can be deduced from Relation 5.1, 5.2, 5.3, and 5.4, the total complexity (e.g. the total computational complexity) is approximately $O(P^2 \times N)$.

The computational complexity according to the first example described above, e.g., for the first (e.g., full) computational model, may hence be computed as:

$$\sim O(30^2 \times 16,000)=O(14,400,000).$$

In many systems, this computational complexity of O(14,400,000) can cause a long computing time, such that the required time budget may be exceeded.

The computational complexity according to the second example described above, e.g., for the second (e.g., reduced) computational model, may hence be computed as:

$$\sim O(5^2 \times 1,600)=O(40,000).$$

In many systems, this computational complexity of O(40,000) may lead to a shorter computing time, e.g., the coefficients of the second computational model may be calculated relatively fast compared to calculating the coefficients of the first computational model within a required time budget.

In some scenarios the time budget for the learning phase (e.g., for generating predistortion coefficients) may be limited, for example, in a scenario of a power up, e.g., a power up of the amplifier device. In order to assure good user experience, the device (e.g., the amplifier device) should be enabled to transmit as soon as possible.

Hence, according to some examples of the present disclosure, it is provided a configurable architecture, which is configured to estimate the reduced model (e.g., to generate the coefficients of the second computational model) in time limited scenarios on the expense of performance, e.g., on the expense of the quality of the output signal of the amplifier device. Moreover, the configurable architecture is configured to estimate the full model (e.g., to generate the coefficients of the first computational model) in scenarios, where the time budget is sufficient for estimating the full model, in order to provide a higher quality of the output signal, e.g., to achieve a better performance, than when employing the reduced computational model to predistort the input signal.

In some examples, it is provided a programmable architecture configured to dynamically switch between a first performance mode and a second performance mode to predistort the input signal of the amplifier device. A performance of the first performance mode and a performance of the second performance mode may correspond to the quality of the corresponding output signal of the amplifier device. The quality of the corresponding output signal may correspond to the EVM, the ACPR (e.g. a spectral mask), the SER, and/or the BER of the output signal. In some examples, the first performance mode may provide a higher performance, e.g., a higher quality of the output signal, than the second performance mode. Further, the first performance mode may correspond to a significant computing power required for calibration (e.g., for generating the predistortion coefficients), whereas the second performance mode may correspond to a limited computing power required for calibration. Moreover, according to the first performance mode a higher number of predistortion coefficients may be generated than according to the second performance mode. In some examples, in the first performance mode the predistortion coefficients may be generated (e.g., estimated) based on the first computational model, e.g., based on Equation 1, whereas in the second performance mode the predistortion coefficients may be generated (e.g., estimated) based on the second computational model, e.g., based on Equation 2. In other words, in the first performance mode the computational effort for generating the predistortion coefficients according to the first computational model is higher than the computational effort in the second performance mode for generating the predistortion coefficients according to the second computational model.

In some examples, the programmable architecture enables an optimization of computing power required for calibration per performance requirements.

Computing power (e.g., the computational effort) required for calibration stage (e.g., for generating predistortion coefficients based on a computational model) of a high bandwidth predistorter, e.g., a predistortion circuit configured to predistort a signal with a large bandwidth, for example a bandwidth larger than 80 MHz, larger than 160 MHz, larger than 500 MHz, or even as large or larger than 2000 MHz, may be high (e.g., an available time budget to generate the predistortion coefficients may be exceeded with the available computing power). Hence, according to some examples the computational model (e.g., the predistorter model) used for predistorting the input signal may be dynamically adjusted. This may avoid increasing computing power in a device (e.g., the amplifier device) on the expense of product cost and may also avoid using, e.g., relying on, the existing (e.g., available) computing power for the calibration on the expense of the calibration duration (e.g., the time needed for generating the predistortion coefficients). Thus, according to some examples, in scenarios sensitive to the calibration duration (for example power up and ramp up of a communication link) a simple predistortion model (e.g., the second computational model with a lower complexity than the first computational model) may be used to predistort the input signal. By using, for example, the second computational model the calibration duration may be shortened, for instance by a factor of 30 or higher, on the expense of performance (e.g., on expense of the quality of the output signal). In other scenarios, e.g., when the available time budget is sufficient to generate the predistortion coefficients based on the first computational model, the full predistortion model, e.g., the first computational model, may be employed to predistort the input signal.

In some examples, the same algorithm may be used to generate the predistortion coefficients based on the first computational model according to Equation 1 and to generate the predistortion coefficients based on the second computational model according to Equation 2, wherein the mathematical model may be reduced in terms of complexity, e.g., Equation 2 may be derived as a special case of Equation 1 by setting the coefficients $p_{1,kq}$ equal to zero. Both types of calibration, e.g., generating the predistortion coefficients based on the first computational model and generating the predistortion coefficients based on the second computational model, may use the same data input.

Figure 3:
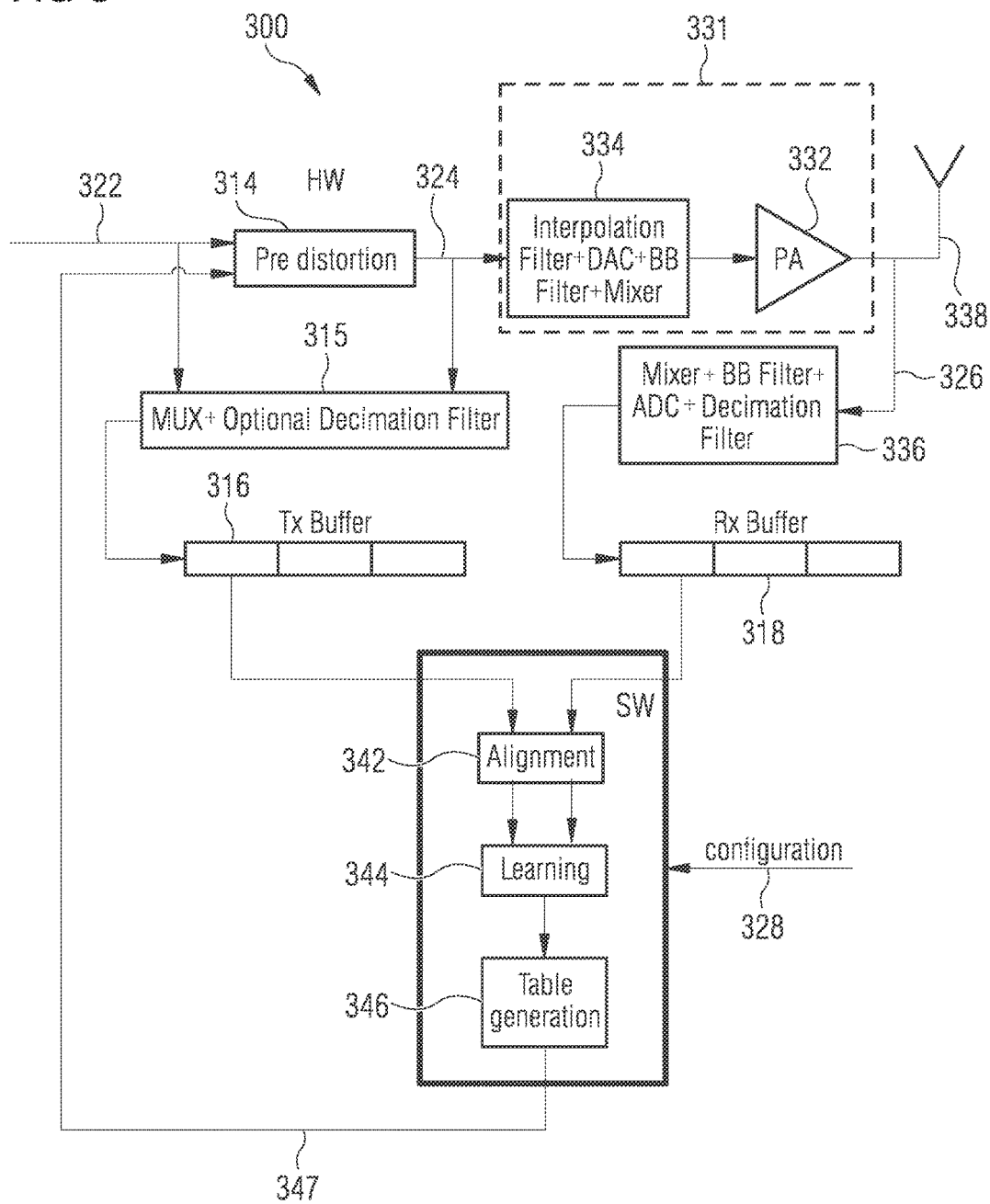
FIG. 3 shows a programmable architecture used for predistorting an input signal.

According to an example, FIG. 3 shows a programmable architecture 300 used for predistorting an input signal 322 of an amplifier device 331. In this example, the amplifier device 331 comprises a mixed signal circuit 334 and a power amplifier 332. The mixed signal circuit 334 may be connected in series to the power amplifier 332. Moreover, the mixed signal circuit 334 may comprise an optional interpolation chain (e.g., an optional interpolation filter), a DAC, filter circuitry (e.g., baseband filters), and mixer circuitry (e.g., an upconversion mixer). In some examples, the mixed signal circuit 334 and the power amplifier 332 are comprised by an analog frontend, for example an analog frontend of a transmitter. Such a transmitter may be integrated into a telecommunication device, for example a telecommunication device operating according to the standard IEEE 802.11, e.g., IEEE 802.11n, IEEE 802.11ac or IEEE 802.11ad. The output of the power amplifier 332 is connected to an antenna 338 so that the amplifier device 331 may be used for wireless telecommunication.

Moreover, an output signal 326 of the power amplifier 332 is connected to a feedback receiver 336. The output signal 326 may, for example, be coupled out of the output of the power amplifier 332 using a power divider, a switch, or a directional coupler (not shown in FIG. 3). The use of a power divider or a directional coupler may allow simultaneously receiving the output signal 326 with the feedback receiver 336 and emitting a corresponding signal from the antenna 338. In case of a power divider, for example, a Wilkinson power divider or a resistive tee may be employed. In case of a switch, for example, a positive-intrinsic-negative-diode (pin-diode) switch, a transistor switch, such as a CMOS switch, or a relay may be used. In case of a directional coupler, the coupler may be a symmetric coupler, e.g. a 3-dB directional coupler, or an asymmetric directional coupler, with a coupling factor between −3 dB and −10 dB, or between −10 dB and −20 dB, or between −20 dB and −40 dB, or even lower than −40 dB. In other words, if an asymmetric directional coupler is used, the output signal 326 has a power that is lower than the power of the corresponding signal emitted from the antenna 338. Further, properties of the output signal 326 that are indicative for the signal quality, such as the EVM, the ACPR, the SER, and the BER, correspond to the properties of the signal emitted from the antenna 338. In other words, the output signal 326 can be seen as a duplicate (of lower power) of the signal emitted from the antenna 338. The feedback receiver 336 may comprise mixer circuitry (e.g., a down-conversion mixer), filter circuitry (e.g., baseband filters), an ADC, and an optional decimation filter.

Further, the programmable architecture 300 comprises a predistortion subcircuit 314. Based on an evaluated selection criterion for a computational model and on selecting a computational model, the predistortion subcircuit 314 is configured to predistort the input signal 322 of the amplifier device 331 according to a first computational model of the amplifier device 331 as well as according to a second computational model of the amplifier device 331. In some examples, the first computational model may have a higher complexity than the second computational model. For example, the first computational model may provide the output signal 326, wherein the output signal 326 depends nonlinearly on a present portion and nonlinearly on a preceding portion of the input signal 322, whereas the second computational model may provide the output signal 326 depending nonlinearly on the present portion of the input signal only. In some examples, the first computational model may comprise a first polynomial and the second computational model may comprise a second polynomial, wherein the first polynomial has more coefficients than the second polynomial. In some examples, the first computational model may be the computational model according to Equation 1, and the second computational model may be the computational model according to Equation 2.

In some embodiments, the predistortion subcircuit 314 may be implemented as nonlinear digital filter, for example, on a digital signal processor, or by being monolithically integrated into the amplifier device 331. This nonlinear digital filter may be implemented as a nonlinear finite impulse response filter (FIR filter) or a nonlinear infinite impulse response filter (IIR filter). Taps of this nonlinear digital filter may correspond and be adapted to the coefficients of the selected computational model, e.g., the first computational model or the second computational model. In other words, the predistortion subcircuit 314 may be configured to support a variable number of coefficients.

Alternatively, in some embodiments, the predistortion subcircuit 314 may be implemented in software or in firmware as a signal processing algorithm, which is carried out on a processing unit/circuit, for example, a central processing unit, a digital signal processor, an application specific integrated circuit (ASIC), or a field programmable gate array (FPGA).

A multiplexer 315 together with an optional decimation filter is configured to select between the input signal 322 (e.g., the undistorted input signal) of the amplifier device 331 and the predistorted input signal 324 (e.g., the output signal of the predistortion subcircuit 314). The multiplexer 315 can thus either transfer the input signal 322 of the amplifier device 331 or the predistorted input signal 324 into a transmitter buffer 316. The output signal 326 of the amplifier device 331 received by the feedback receiver 336 may be transferred by the feedback receiver 336 into a receiver buffer 318. The transmitter buffer 316 and the receiver buffer 318 may comprise memory circuits, for example random access memory (RAM) circuits or shift register circuits, and may be configured to store the input signal 322 or the predistorted input signal 324 and the received output signal 326, respectively.

The predistortion subcircuit 314, the mixed signal circuit 334, the power amplifier 332, the multiplexer 315, the feedback receiver 336, the transmitter buffer 316, and the receiver buffer 318 may be implemented in hardware and may, according to some examples, be integrated into a common semiconductor die, e.g., an integrated circuit (IC). The antenna 338 is also implemented in hardware. In some examples, the antenna 338 may be integrated into the common semiconductor die.

Further, the programmable architecture 300 comprises an alignment block 342 (e.g., an alignment routine), a learning block 344 (e.g., a learning routine), and a table generation block 346 (e.g., a table generation routine). The alignment block 342, the learning block 344, and the table generation block 346 may be implemented in firmware and may be connected in series, wherein the alignment block 342 comes first, the learning block 344 comes second, and the table generation block 346 comes third.

The alignment block 342 may be configured to read the input signal 322 or the predistorted input signal 324 from the transmitter buffer 316. In other words, the transmitter buffer 316 may contain transmitted data as an input to a learning algorithm, e.g., the input signal $\underline{x}$ for Equation 3, which is needed to generate the vector $\underline{d}$ of predistortion coefficients based on Equation 3. Further, the alignment block 342 is configured to read the output signal 326 from the receiver buffer 318. In other words, the receiver buffer 318 may contain received data as an input to the learning algorithm, e.g., the output signal $\underline{y}$ used to generate the matrix $\tilde{Y}$ for Equation 3. In turn, the matrix $\tilde{Y}$ may be used to generate the vector $\underline{d}$ of predistortion coefficients based on Equation 3.

Moreover, the alignment block 342 may be configured to estimate and to correct a gain offset, a phase offset, and a timing offset between input, e.g., the input signal 322, and output, e.g., the output signal 326. For example, this correction may be performed to exclude the feedback receiver 336 from affecting the generation of predistortion coefficients of the selected computational model and to divide the output signal 326 by the signal gain of the power amplifier 332 to provide a gain corrected output signal, as already explained above in the context of FIG. 2b. Further, the correction of the timing offset may be used to enable providing the output signal 326, e.g., a present sample of the output signal 326, depending on a present portion of the input signal 322, e.g., a present sample of the input signal 322, and depending on a previous portion of the input signal 322, e.g., a previous sample (or a plurality of previous samples) of the input signal 322.

The learning block 344 may be configured to receive the input signal 322 corresponding to the input signal $\underline{x}$ in Equation 3 from the alignment block 342 and may be configured to receive the gain offset, phase offset, and timing offset corrected output signal $\underline{\tilde{y}}$ also from the alignment block 342. From the corrected output signal $\underline{\tilde{y}}$ (e.g., from measurements of the output signal 326 of the power amplifier 332) the learning block 344 may then construct an N×P-matrix $\tilde{Y}$, as explained above, and build a system of equations, e.g., a linear system of equations, which corresponds to the selected computational model and which provides the input signal $\underline{x}$ (e.g., the transmitted data in form of a N×1 column vector) depending on the N×P-matrix $\tilde{Y}$ and depending on a P×1 column vector $\underline{d}$ containing the predistortion coefficients, which are to be determined (e.g., generated). In here, P corresponds to the total number of predistortion coefficients and N corresponds to the length, e.g., the number of samples, of the input signal 322 and/or the output signal 326. In some examples, the resulting system of equations may be formulated as:

$$\tilde{Y} \cdot \underline{d} = \underline{x} \qquad \text{Equation 6:}$$

The corresponding linear system of normal equations to Equation 6 is given by Equation 4. Substituting A for $\tilde{Y}^H \cdot \tilde{Y}$ and b for $\tilde{Y}^H \cdot \underline{x}$ in Equation 4, yields:

$$A \cdot \underline{d} = b \qquad \text{Equation 7:}$$

Further, the learning block 344 may be configured to compute a Cholesky decomposition of the matrix A, e.g., $A = L \cdot L^H$, wherein in L is a lower triangular matrix. Moreover, the learning block 344 may be configured to solve Equation 7 for the vector $\underline{d}$ containing the predistortion coefficients by employing the Cholesky decomposition of the matrix A. This may be accomplished in two steps. In a first step, an intermediate result vector c may be computed by forward elimination, e.g., by solving $L \cdot c = b$ for c. In a second step, the vector $\underline{d}$ containing the predistortion coefficients may be computed by backward elimination, e.g., by solving $L^H \cdot \underline{d} = c$ for $\underline{d}$. Hence, the learning block 344 may be configured to generate a set of coefficients, e.g., the vector $\underline{d}$ containing the predistortion coefficients, for the selected computational model.

The table generation block 346 may be configured for generation of predistortion tables that may be loaded to the predistortion block, e.g., the predistortion subcircuit 314. Hence, the predistortion subcircuit 314 may predistort the input signal 322 based on the selected computational model.

In other words, a predistortion table may comprise the vector $\underline{d}$ containing the predistortion coefficients. An output of the table generation block 346 may be coupled to the predistortion subcircuit 314 via a predistortion feedback signal 347 in order to provide the predistortion coefficients to the predistortion subcircuit 314. In this way, a predistortion loop may be completed.

According to an example, the alignment block 342, the learning block 344, the table generation block 346, and the predistortion block, e.g., the predistortion subcircuit 314, are programmable and are configured to support predistortion models with a different number of coefficients, e.g., the first computational model and/or the second computational model.

Based on the evaluated selection criterion for a computational model of the amplifier device 331, e.g., the mixed signal circuit 334 and the power amplifier 332, the programmable architecture 300 may be configured to predistort the input signal 322 according to the first computational model or according to the second computational model, wherein the first computational model has a higher complexity, e.g., a higher number of coefficients, than the second computational model.

In some examples of the present disclosure, the first set of coefficients of the first model is generated, while predistorting the input signal using the second set of coefficients of the second computational model. For example, the programmable architecture 300 may be integrated into a transmitter of a telecommunication device. The telecommunication device may be employed to create a new telecommunication connection. For example, the telecommunication device may be a laptop personal computer (PC), a tablet PC, or a smart phone, which may connect to a router via a wireless local area network (WLAN), for example, in order to obtain internet access. To create the new telecommunication connection, the telecommunication device and the router may exchange control messages, for example, messages containing network addresses, internet protocol addresses, media access control addresses, passwords, pilot symbols for estimating a transfer function of a used telecommunication channel, and/or information about which frequencies and which modulation are to be used during the telecommunication.

The exchange of the control messages may be carried out at low data rates, e.g., at legacy rates. For example, the used telecommunication channel may have a bandwidth of 80 MHz or larger, but for exchanging the control messages a control signal of a lower bandwidth may be employed, for example the control signal may have a bandwidth of 20 MHz or smaller. For exchanging the control messages, e.g., for transmitting a control signal from the telecommunication device to the router, the programmable architecture 300 may predistort the control signal in order to provide a corresponding output control signal of a high quality, e.g., the EVM and the ACPR of the output control signal can fulfill the requirements of a telecommunication standard, which upon the telecommunication is based on, e.g., an IEEE 802.11 standard, like IEEE 802.11n, IEEE 802.11ac, and/or IEEE 802.11ad. The telecommunication device may then evaluate the selection criterion for selecting a computational model of the amplifier device 331, e.g., the mixed signal circuit 334 and the power amplifier 332.

Figure 4:
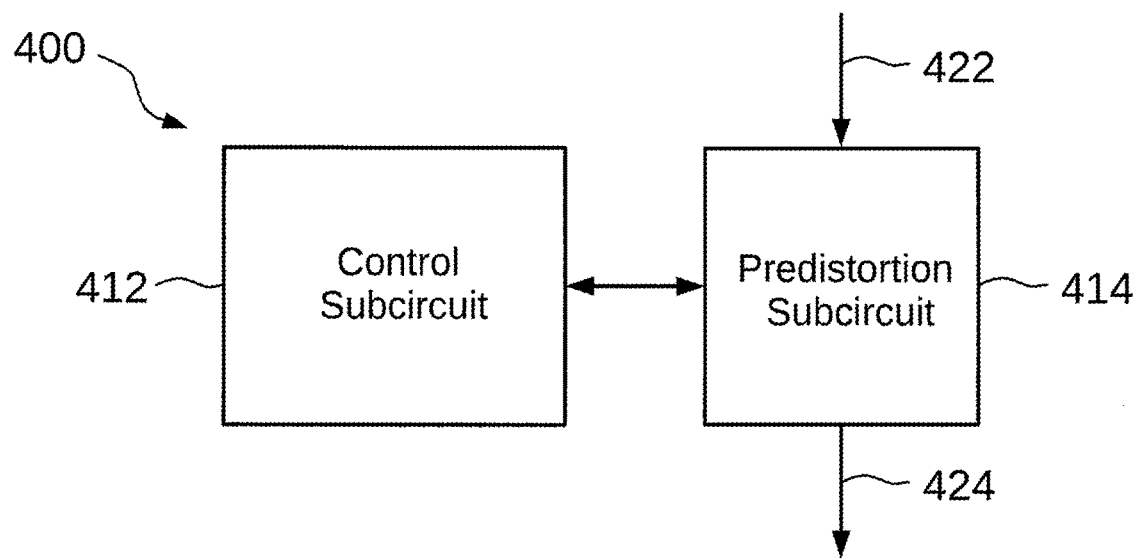
FIG. 4 shows a block diagram of an example of a predistortion circuit.
Figure 5:
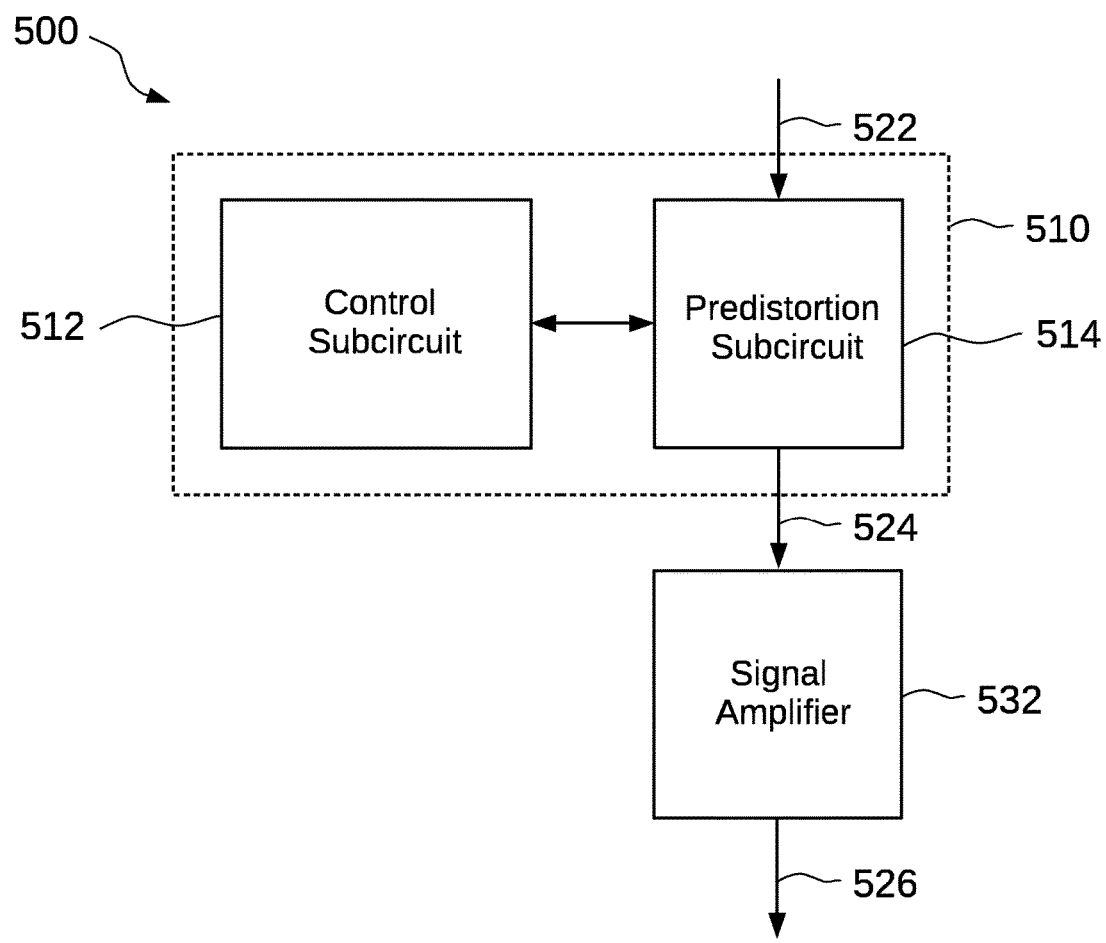
FIG. 5 shows an example of an amplifier device comprising a signal amplifier and a predistortion circuit.

The selection criterion may, for example, be evaluated by a control subcircuit (similar to the control subcircuit 412/512 as shown in FIGS. 4 and 5) of the amplifier device. In this example, the selection criterion may comprise a dependence on a property of the input signal 322 of the amplifier device 331, e.g., the bandwidth of the input signal 322. As in this example, upon creation of the telecommunication connection, the input signal 322 (e.g., the control signal) has a low bandwidth, e.g., 20 MHz or lower, the selection criterion may determine to use the second computational model (e.g. the second computational model according to Equation 2), which has a lower complexity than the first computational model and requires a lower computational effort to generate its coefficients than the first computational model, for predistorting the input signal 322.

The control subcircuit (not shown in FIG. 3) may then send a configuration signal 328 to the programmable architecture 300, such that the programmable architecture 300 may generate the coefficients of the second computational model, as explained above, and use the generated coefficients of the second computational model to predistort the input signal 322, which, in this scenario, corresponds to the control signal used for creating the new telecommunication connection. As explained above, since in this example the bandwidth of the input signal 322 is low, the input signal 322 may be unsusceptible towards distortions originating from high frequency effects, such as memory effects, transport delay, and/or rapid thermal time constants, of semiconductor devices comprised by the amplifier device 331.

However, the input signal 322 may still be susceptible to compression effects, e.g., output power compression of the power amplifier 332. Hence, the second computational model, which can treat compression effects by, for example, providing the output signal 326 depending nonlinearly on the input signal 322, but may not consider memory effects, transport delay, and/or rapid thermal time constants, may be used to predistort the input signal 322 (e.g., the control signal). By selecting the second computational model, which may require a lower computational effort to generate its coefficients than the first computational model, computing time may be reduced and the telecommunication connection may be created faster. Moreover, due to the lower computational effort less computational operations may be carried out and thus less electrical energy may be consumed, e.g., electrical energy may be saved, which may in turn lead to longer recharge cycles of the telecommunication device, in case the telecommunication device is battery powered.

After having created the telecommunication connection, the input signal 322 may be switched from the control signal to a data signal (e.g., a payload data signal), wherein the data signal may have a larger bandwidth, for example, a bandwidth of 80 MHz or larger. Thus, the selection criterion may be evaluated again, e.g., reevaluated, and based on the larger bandwidth of the input signal 322 (e.g., the data signal) the selection criterion may now determine to use the first computational model (e.g., the first computational model according to Equation 1), which has a higher complexity than the second computational model. Due to the larger bandwidth, the input signal 322 may also be susceptible towards distortions due to high frequency effects, such as memory effects, transport delay, and/or rapid thermal time constants, of semiconductor devices comprised by the amplifier device 331, as well as to compression effects. Thus, the first computational model, which may provide the output signal 326 depending nonlinearly on a present portion and depending nonlinearly on a preceding portion of the input signal, may be selected to predistort the input signal 322 (e.g., the data signal). This can provide a high quality of the corresponding output signal 326 and of the signal emitted from the antenna 338, e.g., the EVM and the ACPR of the output signal 326 and of the signal emitted from the antenna 338 can fulfill the requirements of the telecommunication standard, which upon the telecommunication is based on.

In some examples, as the second computational model according to Equation 2 can be derived as a special case of the first computational model according to Equation 1, the coefficients of the second computational model, e.g., the coefficients $p_k$ of Equation 2, may be set equal to these coefficients of the first computation model, which correspond to the coefficients of the second computational model, e.g., the coefficients $p_k$ of Equation 1. In this way, when generating the coefficients of the first computational model, e.g., when solving the linear system of equations (as described by Equations 3, 4, 6, and 7) a share of the solution, e.g., the coefficients $p_k$, is already known, such that the computational effort for generating the coefficients of the first computational model may be reduced, which can save both computing time as well as electrical energy. Moreover, in some examples, while the coefficients of the first computational model (e.g., the first set of coefficients) are being generated, the second computational model may be used to predistort the input signal. In this way, the predistortion of the input signal may be expedited.

In some examples, the method for predistorting an input signal of an amplifier device comprises observing a trigger condition. On occurrence of the trigger condition, the method further comprises reevaluating the selection criterion and/or generating the set of coefficients for the selected computational model. Herein, the selected computational model may be a newly selected computational model in course of the reevaluation of the selection criterion or may be a computational mode that was used before the occurrence of the trigger condition and whose coefficients may be regenerated due to the occurrence of the trigger condition.

Referring to FIG. 3, a trigger signal corresponding to the occurrence of the trigger condition may be comprised by the configuration signal 328 of the programmable architecture 300. For example, the configuration signal 328 may comprise a plurality of bits, wherein one bit corresponds to the trigger signal and is configured to indicate the occurrence of the trigger condition. Upon occurrence of the trigger condition, the control subcircuit (not shown in FIG. 3) may initiate the programmable architecture 300 to either regenerate the coefficients of the computational model, which has been selected to predistort the input signal 322, or to switch to a different computational model, generate its coefficients, and use it to predistort the input signal 322.

A trigger condition may, for instance occur in course of a change of a configuration of the amplifier device 331, e.g., the mixed signal circuit 334 and the power amplifier 332. For example, the supply voltage and/or the gain (e.g., the signal gain) of the power 322 amplifier may be changed (e.g., increased or decreased) to one aiming different performance and/or power efficiency tradeoffs. Another example for a change of the configuration of the amplifier device 331 is a change of the carrier frequency of the output signal 326, which may, for example, be accomplished by changing an oscillator frequency of the amplifier device 331, e.g., the mixed signal circuit 334. Such changes in configuration of the amplifier device 331 may, for example, be performed, when the telecommunication device comprising the amplifier device 331 moves to a new geo constraint according to an indication from a co-located cellular design, and/or when the telecommunication device identifies a change in proximity to its telecommunication partner (e.g., to the other side), which justifies a new tradeoff configuration, e.g., when anyway transmit power does not need to be high for high or extreme proximity or change to the other direction. In other words, if the telecommunication device detects a change in a distance to its telecommunication partner, it may adapt the supply voltage, the gain, and/or the maximum output power of the power amplifier 332. For example, if the distance becomes smaller, the supply voltage, the gain, and/or the maximum output power of the power amplifier 332 may be decreased. If the distance becomes larger, the supply voltage, the gain, and/or the maximum output power of the power amplifier 332 may be increased.

For example, the trigger condition may occur during a telecommunication, wherein the input signal 322 may correspond to a data signal with a large bandwidth, e.g., larger than 80 MHz (as explained above), so that the first computational model is used to predistort the input signal. Due to the occurrence of the trigger signal, the evaluation criterion may be reevaluated. The evaluation criterion may, for instance, depend on an available computing power and a time budget available for generating the coefficients of the selected computational model. If the available computing power is not sufficient to regenerate the coefficients of the first computational model within the available time budget, the selection criterion may determine to use the second computational model to predistort the input signal 322, whose coefficients may be generated with the available computing power within the available time budget. Hence, after having generated the coefficients of the second computational model, the predistortion subcircuit 314 may predistort the input signal 322 by using the second computational model. To further enhance the quality of the corresponding output signal 326, the programmable architecture may generate the first set of coefficients of the first computational model, while predistorting the input signal 322 using the second computational model. After generation of the first set of coefficients of the first computational model, the predistortion subcircuit 314 may predistort the input signal 322 by using the first computational model. In this way, after the occurrence of the trigger condition, by first using the second computational model to predistort the input signal 322 a ramping of the transmit performance may be expedited.

In another example, the trigger condition may occur when the amplifier device 331 and/or the telecommunication device comprising the amplifier device 331 is switched from an energy saving mode back into an operating mode, e.g., when waking from such long sleep and/or power down. This may lead to changes in temperature of the amplifier device 331 and/or the telecommunication device and/or to changes in power supply from the platforms battery (e.g., cellular platforms). A telecommunication may hence start using the second computational model for predistorting the input signal first, wherein the coefficients of the second computational model can be generated faster than the coefficients of the first computational model, such that a telecommunication connection may be established faster. In other words, a sub-optimal predistortion is carried out for expedited ramping of transmit performance. Afterwards, while using the second computational model to predistort the input signal 322, the programmable architecture may generate the first set of coefficients of the first computational model to use the first computational model for predistorting the input signal 322 to further enhance the quality of the corresponding output signal 326.

According to an example, the trigger condition and thus the reevaluating of the selection criterion and the generation (or regeneration) of the set of coefficients for the selected computational model may occur in course of changes in the external environment, for example sudden temperature changes, which are higher than a predefined maximum temperature deviation from the temperature at which the coefficients of the used computational model have been determined, and/or changes in voltage standing wave ratio.

According to another aspect of the present disclosure, it is provided a predistortion circuit. FIG. 4 shows a block diagram of a predistortion circuit 400 according to an example. The predistortion circuit 400 is configured to predistort an input signal 422 of an amplifier device. The predistortion circuit comprises a control subcircuit 412 and a predistortion subcircuit 414. The control subcircuit 412 is configured to evaluate a selection criterion for a computational model of the amplifier device, the computational model providing an output signal of the amplifier device for the input signal 424 of the amplifier device. Further, the control subcircuit 412 is configured to select between a first computational model and a second computational model based on the evaluated selection criterion. The predistortion subcircuit 414 is configured to predistort the input signal 422 using the selected computational model, e.g., the predistortion subcircuit 414 is configured to receive an undistorted input signal 422 and to provide a corresponding predistorted input signal 424 to the amplifier device.

In some examples, the control subcircuit 412 may further be configured to generate a set of coefficients for the selected computational model.

In some examples, the control subcircuit 412 may further be configured to determine an available computing power and/or an available time budget. The available time budget may correspond to a time during which the coefficients of the selected computational model need to be generated and/or to a time during which the input signal needs to be predistorted.

For example, the control subcircuit 412 may have a priori information about how many computational operations may be performed in order to generate the coefficients of a computational model. In addition, the control subcircuit 412 may determine an available computing power by querying an arithmetic logic unit and/or a central processing unit about its available computing power, e.g., about how many computational operations may be performed per unit time. Herein, the control subcircuit 412 may be connected to the arithmetic logic unit and/or the central processing unit or may comprise the arithmetic logic unit and/or the central processing unit. From the number of computational operations needed to generate the coefficients of a computational model and from the available computing power, the control subcircuit 412 may determine a time needed for generating the coefficients of the computational model. The control subcircuit 412 may then compare the time needed for generating the coefficients of the computational model to the available time budget in order to decide, whether the available time budget is sufficient for generating the coefficients of the computational model. The control subcircuit 412 may have a priori information about the available time budget, for example, in form of a lookup-table which contains available time budgets referring to different telecommunication standards, e.g., the standard IEEE 802.11, and to different scenarios within these telecommunication standards, for instance, creating a telecommunication connection or sending data messages (e.g., payload data messages) via a telecommunication connection.

In some examples, the control subcircuit 412 is further configured to determine a property of the input signal 422 and/or a property of the amplifier device.

In some examples, the property of the input signal 422 is at least one of a power of the input signal 422, a power dynamic range of the input signal 422, a carrier frequency of the input signal 422, a bandwidth of the input signal 422, and a modulation of the input signal 422.

In some examples, the control subcircuit 412 can determine properties of the input signal 422 by measurements or have a priori information of properties of the input signal 422, e.g., the power of the input signal 422, the power dynamic range of the input signal 422, the carrier frequency of the input signal 422, the bandwidth of the input signal 422, and/or the modulation of the input signal 422. Herein, the predistorted input signal 424 may be analyzed and/or the undistorted input signal 422 may be analyzed to determine the properties of the input signal of the amplifier device. Without loss of generality, hereinafter it is only referred to the undistorted input signal 422, which is referred to as the input signal 422.

For example, during a telecommunication the control subcircuit 412 may itself set the property of the input signal 422, e.g., for creating a telecommunication connection using control messages (as explained above) the control subcircuit 412 may set the bandwidth of the input signal 422 (which corresponds to a control message to be transmitted) to a low value, for example, to 20 MHz or lower. During creating the telecommunication connection, the control subcircuit 412 may also adjust and hence set the modulation of the input signal 422. For example, during creating the telecommunication connection different modulation orders (e.g., 4-QAM, 16-QAM, 64-QAM, and/or 256-QAM) may be tried, e.g., the order of the modulation may be increased to enhance the data rate of the telecommunication as long as the SER or the BER of the telecommunication stays below a certain boundary. Moreover, during creating the telecommunication connection, the control subcircuit 412 may adjust and hence set the carrier frequency of the input signal 422. For example, the carrier frequency of the input signal 422 may be set to a center frequency of an available frequency channel. The available frequency channel may, for example, be communicated to the control subcircuit 412 by the corresponding telecommunication partner or may be sensed by the control subcircuit 412 according to a carrier sense multiple access (CSMA) and collision detection protocol. After having created the telecommunication connection, the amplifier device may transmit data messages. Hence, the input signal 422 may then correspond to a data message and the control subcircuit 412 may set the bandwidth of the input signal 422 to a larger value, for example to 80 MHz or larger. Since, according to some examples, the control subcircuit 412 may set properties of the input signal 422, the control subcircuit 412 may have also information about these properties of the input signal 422 and may hence be configured to determine these properties of the input signal 422.

In some examples, the control subcircuit 412 can determine properties of the input signal 422 by measurements. For example, the control subcircuit 412 may be connected to a detector circuit or may comprise a detector circuit, wherein the detector circuit is configured to detect, e.g., to measure, a property of the input signal 422. The detector circuit may, for instance, comprise an input power detector (e.g., an envelope detector) to determine the power and/or the power dynamic range of the input signal 422. The control subcircuit 412 may further be configured to determine the bandwidth and or the carrier frequency of the input signal 422. For example, the control subcircuit 412 may be configured to compute a Fast-Fourier-Transformation of the input signal 422, wherein the input data to the FFT, e.g., the input signal 422 in time domain representation (e.g., samples of the input signal 422) is provided to the control subcircuit 412 by the predistortion subcircuit 414, or wherein the control subcircuit 412 comprises an additional DAC to sample the input signal 422.

In some examples, the property of the amplifier device is at least one of a supply voltage, a gain, a maximum output power, and an oscillator frequency. The control subcircuit 412 may be configured to determine properties of the amplifier device. For example, the control subcircuit 412 may sense the supply voltage of the amplifier device, e.g., by yet another DAC, or it may have a priori information about the supply voltage, as itself may adjust and hence set the supply voltage of the amplifier device. For example, it may reduce the supply voltage of the amplifier device in order to save electrical energy. The control subcircuit 412 may be configured to determine a temperature of the amplifier device and/or a temperature of an environment of the amplifier device, e.g., by being connected to a corresponding temperature sensor or by comprising a temperature sensor, wherein the temperature sensor is configured to sense the temperature of the amplifier device and/or the temperature of the environment of the amplifier device. Moreover, the control subcircuit 412 may measure the maximum output power of the amplifier device via an output power detector (e.g., an envelope detector), which is configured to detect the power of the output signal of the amplifier device. The output power detector may be comprised by the control subcircuit 412 or may be connected to the control subcircuit 412. Further, the control subcircuit 412 may be configured to adjust and hence to set the gain (e.g., the signal gain) of the amplifier device. For example, the telecommunication partner may indicate to the control subcircuit 412 that the power of the received signal (e.g., the output signal of the amplifier device) at the telecommunication partner is too low, such that the control subcircuit 412 may set the gain (e.g., the signal gain) of the amplifier device to a higher value in order to provide an output signal of higher power. In some examples, the control subcircuit 412 may be configured to measure the gain of the amplifier device. For example, the control subcircuit 412 may measure the power of the input signal 422 with the input power detector and the power of the output signal with the output power detector. By computing the difference between the power of the output signal and the power of the input signal 422, the control subcircuit 412 may determine the gain of the amplifier device.

In some examples, the control subcircuit 412 may be configured to set an oscillator frequency of an oscillator (e.g., a local oscillator) of the amplifier device and thus have information (e.g., be configured to determine) a carrier frequency of the output signal of the amplifier device. Herein, the oscillator of the amplifier device may be configured to up-convert the predistorted input signal 424 into an RF carrier domain. By determining the frequency of the input signal 422, e.g., via an FFT (as explained above), and by determining the frequency of the local oscillator, the control subcircuit 412 may determine the carrier frequency of the output signal of the amplifier device. Additionally, the control subcircuit may be configured to set and/or to determine a multiplication factor of the local oscillator frequency, if not the fundamental frequency but a higher harmonic frequency of the local oscillator is used to up-convert the predistorted input signal 424.

In some examples, the control subcircuit 412 is configured to receive a trigger signal. Depending on the trigger signal, the control subcircuit 412 is configured to reevaluate the selection criterion and/or is configured to generate the set of coefficients for the selected computational model.

In some examples, the control subcircuit 412 is configured to determine a first set of coefficients of the first computational model, while the predistortion subcircuit 414 predistorts the input signal using a second set of coefficients of the second computational model.

In some examples, the control subcircuit 412 and/or the predistortion subcircuit 414 may be integrated into a common semiconductor device. Moreover, the control subcircuit 412 and/or the predistortion subcircuit 414 may be comprised by an integrated circuit, such as an ASIC, an FPGA, a CPLD, a DSP, a Microcontroller, and or a central processing unit (CPU). The predistortion subcircuit 414 may comprise a nonlinear FIR or a nonlinear IIR digital filter.

As illustrated in FIG. 5, according to yet another aspect of the present disclosure, it is provided an amplifier device 500. The amplifier device 500 comprises a signal amplifier 532, which is configured to receive an input signal 524 (e.g., a predistorted input signal) and to provide a corresponding output signal 526. The amplifier device 500 further comprises a predistortion circuit 510, as illustrated above in FIG. 4, e.g., the predistortion circuit 510 comprises a control subcircuit 512 and a predistortion subcircuit 514. The control subcircuit 512 is configured to evaluate a selection criterion for a computational model of the signal amplifier 532, the computational model providing the output signal 526 of the signal amplifier 532 for the input signal 524 of the signal amplifier 532. Further, the control subcircuit 512 is configured to select between a first computational model and a second computational model based on the evaluated selection criterion. The predistortion subcircuit 514 is configured to receive an undistorted input signal 522 and to provide the corresponding predistorted input signal 524 to the signal amplifier 532 using the selected computational model of the signal amplifier 532.

In some examples, the signal amplifier 532 comprises at least one of an amplifier circuit, a mixer, a baseband filter, a digital-to-analog converter, and an interpolation filter. The amplifier circuit may comprise a semiconductor amplifier circuit and/or a tube amplifier circuit.

The amplifier circuit may for example comprise at least one of a power amplifier circuit, a driver amplifier circuit, a variable gain amplifier circuit, and/or a low noise amplifier circuit.

According to yet another aspect of the present disclosure, it is provided a transmitter. The transmitter comprises an amplifier device as described above, e.g., similar to the amplifier device 500 of FIG. 5. The amplifier device comprises a predistortion circuit, similar to the predistortion circuit 400 of FIG. 4 or similar to the predistortion circuit 510 of FIG. 5, and a signal amplifier, similar to the signal amplifier 532 of FIG. 5.

Figure 6:
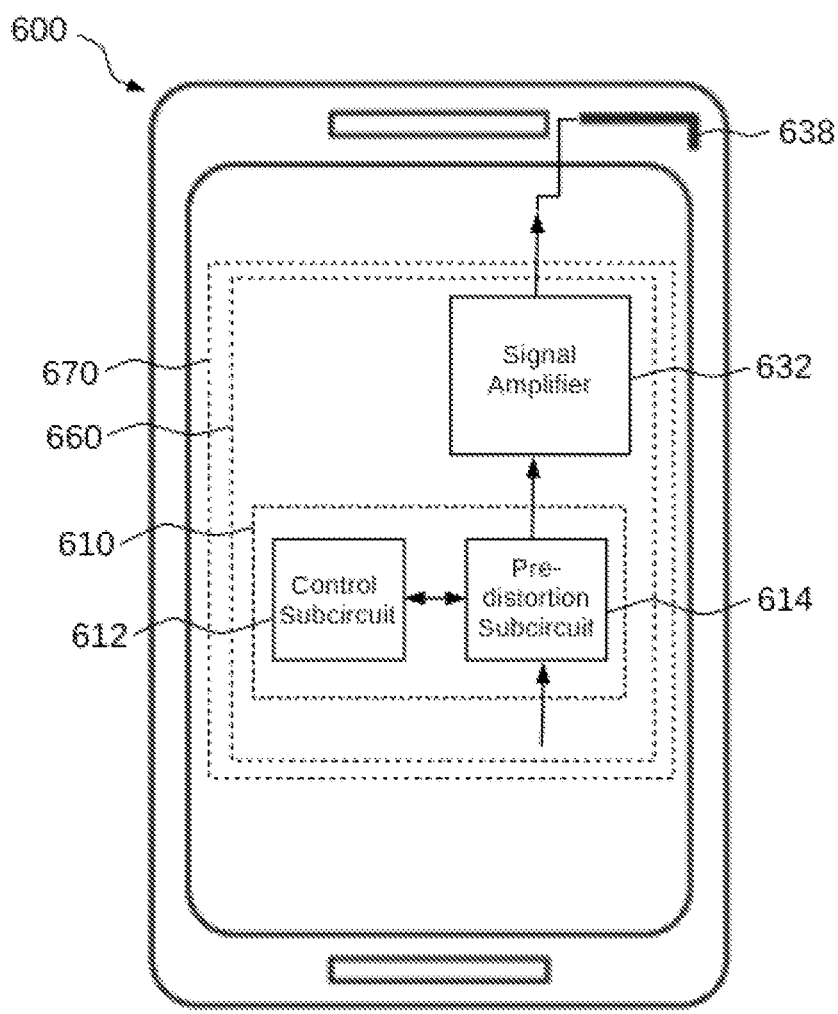
FIG. 6 shows an example of a telecommunication device comprising a transmitter, the transmitter comprising a signal amplifier and a predistortion circuit.

As illustrated in FIG. 6, according to yet another aspect of the present disclosure, it is provided a telecommunication device 600. The telecommunication device 600 comprises a transmitter 670 as explained above. The transmitter 670 comprises amplifier device 660 similar to the amplifier device 500 of FIG. 5. The amplifier device 660 comprises a signal amplifier 632, which is similar to the signal amplifier 532 of FIG. 5, and a predistortion circuit 610, which is similar to the predistortion circuit 400 of FIG. 4 or similar to the predistortion circuit 510 of FIG. 5. The predistortion circuit 610 comprises a control subcircuit 612, similar to the control subcircuit 412 of FIG. 4, as well as a predistortion subcircuit 614, which is similar to the predistortion subcircuit 414 of FIG. 4.

In some examples, the telecommunication device 600 may be a mobile telecommunication device. To this end, the transmitter 670 is coupled to an antenna 638. Mobile telecommunication devices as disclosed in FIG. 6 using a transmitter 670 according to the examples described herein may operate according to every known and future telecommunication standard, such as for example: one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

A mobile telecommunications device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transmitter, transceiver or terminal may also be referred to as UE or user in line with the 3GPP terminology. A base station transmitter or a base station transceiver can be located in the fixed or stationary part of the network or system. A base station transmitter or a base station transceiver may, for example, correspond to a remote radio head, a transmission point or an access point. A base station transmitter or a base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

In the following, some examples are described. Example 1 is a method for predistorting an input signal of an amplifier device, the method comprising evaluating a selection criterion for a computational model of the amplifier device, the computational model providing an output signal of the amplifier device for the input signal of the amplifier device, selecting between a first computational model and a second computational model based on the evaluated selection criterion, and predistorting the input signal using the selected computational model.

In example 2, the subject matter of example 1 can optionally include the first computational model having a higher complexity than the second computational model.

In example 3, the subject matter of example 1 or example 2 can optionally include generating a set of coefficients for the selected computational model.

In example 4, the subject matter of example 3 can optionally include generating a first set of coefficients for the first computational model requiring a higher computational effort than generating a second set of coefficients for the second computational model.

In example 5, the subject matter of example 4 can optionally include the first set of coefficients of the first computational model being generated, while predistorting the input signal using the second set of coefficients of the second computational model.

In example 6, the subject matter of any of the examples 1 to 5 can optionally include at least one of the first computational model and the second computational model providing the output signal depending nonlinearly on the input signal.

In example 7, the subject matter of example 6 can optionally include the first computational model providing the output signal depending on a present portion and depending on a preceding portion of the input signal.

In example 8, the subject matter of any of the examples 1 to 7 can optionally include the first computational model comprising a first polynomial and the second computational model comprising a second polynomial, the first polynomial comprising more coefficients than the second polynomial.

In example 9, the subject matter of any of the examples 1 to 8 can optionally include the selection criterion depending on at least one of an available computing power and an available time budget.

In example 10, the subject matter of any of the examples 1 to 9 can optionally include the selection criterion depending on at least one of a property of the input signal and a property of the amplifier device.

In example 11, the subject matter of example 10 can optionally include the property of the input signal being at least one of a power of the input signal, a power dynamic range of the input signal, a carrier frequency of the input signal, a bandwidth of the input signal, and a modulation of the input signal.

In example 12, the subject matter of example 10 or example 11 can optionally include the property of the amplifier device being at least one of a supply voltage, a gain, a maximum output power, and an oscillator frequency.

In example 13, the subject matter of example 3 can optionally include observing a trigger condition and at least one of reevaluating the selection criterion and generating the set of coefficients for the selected computational model on occurrence of the trigger condition.

In example 14, the subject matter of example 13 can optionally include the trigger condition comprising at least one of a time out, a temperature change, and a change of quality of the output signal.

In example 15, the subject matter of example 14 can optionally include the quality of the output signal being at least one of an error vector magnitude, an adjacent channel power ratio, a symbol error rate, and a bit error rate.

In example 16, the subject matter of any of the examples 1 to 15 can optionally include using a Cholesky decomposition for determining a least squares solution of a linear system of equations, wherein the linear system of equations corresponds to the selected computational model.

In example 17, the subject matter of any of the examples 1 to 16 can optionally include the amplifier device comprising a signal amplifier.

In example 18, the subject matter of example 17 can optionally include the signal amplifier comprising an amplifier circuit.

Example 19 relates to a predistortion circuit configured to predistort an input signal of an amplifier device, the predistortion circuit comprising a control subcircuit configured to evaluate a selection criterion for a computational model of the amplifier device, the computational model providing an output signal of the amplifier device for the input signal, and configured to select between a first computational model and a second computational model based on the evaluated selection criterion, and a predistortion subcircuit configured to predistort the input signal using the selected computational model.

In example 20, the subject matter of example 19 can optionally include the control subcircuit being further configured to generate a set of coefficients for the selected computational model.

In example 21, the subject matter of example 19 or example 20 can optionally include the control subcircuit being further configured to determine at least one of an available computing power and an available time budget.

In example 22, the subject matter of any one of the examples 19 to 21 can optionally include the control subcircuit being further configured to determine at least one of a property of the input signal and a property of the amplifier device.

In example 23, the subject matter of example 22 can optionally include the property of the input signal being at least one of a power of the input signal, a power dynamic range of the input signal, a carrier frequency of the input signal, a bandwidth of the input signal, and a modulation of the input signal.

In example 24, the subject matter of example 22 or example 23 can optionally include the property of the amplifier device being at least one of a supply voltage, a gain, a maximum output power, and an oscillator frequency.

In example 25, the subject matter of any one of the examples 19 to 24 can optionally include the control subcircuit being configured to receive a trigger signal, wherein, depending on the trigger signal, the control circuit is configured to reevaluate the selection criterion or generate the set of coefficients for the selected computational model.

In example 26, the subject matter of any one of the examples 19 to 25 can optionally include the control subcircuit being configured to determine a first set of coefficients of the first computational model, while the predistortion subcircuit predistorts the input signal using a second set of coefficients of the second computational model.

Example 27 relates to an amplifier device comprising a signal amplifier configured to receive an input signal and to provide a corresponding output signal, and comprising the predistortion circuit of any one of the examples 19 to 26.

In example 28, the subject matter of example 27 can optionally include the signal amplifier comprising at least one of an amplifier circuit, a mixer, a baseband filter, a digital-to-analog converter, and an interpolation filter.

Example 29 relates to a transmitter comprising an amplifier device of example 27 or example 28.

Example 30 relates to a telecommunication device comprising a transmitter of example 29.

Example 31 relates to a computer program including program code, when executed, to cause a machine to perform the method of any one of examples 1 to 18.

Example 32 relates to a non-transitory machine readable storage medium including program code, when executed, to cause a machine to perform the method of any one of examples 1 to 18.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for something". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

The invention claimed is:

1. A method for predistorting an input signal of an amplifier device comprising:
    evaluating a selection criterion for a computational model of the amplifier device, the computational model providing an output signal of the amplifier device for the input signal of the amplifier device;
    selecting between a first computational model and a second computational model based on the evaluated selection criterion;
    generating a set of coefficients for the selected computational model, wherein generating a first set of coefficients for the first computational model requires a higher computational effort than generating a second set of coefficients for the second computational model; and
    predistorting the input signal using the selected computational model.

2. The method of claim 1, wherein the first computational model has a higher complexity than the second computational model.

3. The method of claim 1, wherein the first set of coefficients of the first computational model is generated, while predistorting the input signal using the second set of coefficients of the second computational model.

4. The method of claim 1, wherein at least one of the first computational model and the second computational model provides the output signal depending nonlinearly on the input signal.

5. The method of claim 4, wherein the first computational model provides the output signal depending on a present portion and depending on a preceding portion of the input signal.

6. The method of claim 1, wherein the first computational model comprises a first polynomial and wherein the second computational model comprises a second polynomial, the first polynomial comprising more coefficients than the second polynomial.

7. The method of claim 1, wherein the selection criterion depends on at least one of an available computing power and an available time budget.

8. The method of claim 1, wherein the selection criterion depends on at least one of a property of the input signal and a property of the amplifier device.

9. The method of claim 8, wherein the property of the input signal is at least one of a power of the input signal, a power dynamic range of the input signal, a carrier frequency of the input signal, a bandwidth of the input signal, and a modulation of the input signal.

10. The method of claim 8, wherein the property of the amplifier device is at least one of a supply voltage, a gain, a maximum output power, and an oscillator frequency.

11. The method of claim 1, further comprising:
    observing a trigger condition and at least one of reevaluating the selection criterion and generating the set of coefficients for the selected computational model on occurrence of the trigger condition.

12. The method of claim 11, wherein the trigger condition comprises at least one of a time out, a temperature change, and a change of quality of the output signal.

13. The method of claim 12, wherein the quality of the output signal is at least one of an error vector magnitude, an adjacent channel power ratio, a symbol error rate, and a bit error rate.

14. The method of claim 1, further comprising using a Cholesky decomposition for determining a least squares solution of a linear system of equations, wherein the linear system of equations corresponds to the selected computational model.

15. The method of claim 1, wherein the amplifier device comprises a signal amplifier.

16. The method of claim 15, wherein the signal amplifier comprises an amplifier circuit.

17. A predistortion circuit configured to predistort an input signal of an amplifier device comprising:
    a control subcircuit configured to:
        evaluate a selection criterion for a computational model of the amplifier device, the computational model providing an output signal of the amplifier device for the input signal, and configured to select between a first computational model and a second computational model based on the evaluated selection criterion and
        generate a set of coefficients for the selected computational model, wherein generating a first set of coefficients for the first computational model requires a higher computational effort than generating a second set of coefficients for the second computational model; and
    a predistortion subcircuit configured to predistort the input signal using the selected computational model.

18. An amplifier device, comprising:
    a predistortion circuit configured to predistort an input signal of the amplifier device comprising:
    a control subcircuit configured to:
        evaluate a selection criterion for a computational model of the amplifier device, the computational model providing an output signal of the amplifier device for the input signal, and configured to select between a first computational model and a second computational model based on the evaluated selection criterion and
        to generate a set of coefficients for the selected computational model, wherein generating a first set of coefficients for the first computational model requires a higher computational effort than generating a second set of coefficients for the second computational model;
    a predistortion subcircuit configured to predistort the input signal using the selected computational model; and
    a signal amplifier configured to receive the predistorted input signal and to provide a corresponding output signal.

19. The amplifier device of claim 18, wherein the signal amplifier comprises at least one of an amplifier circuit, a mixer, a baseband filter, a digital-to-analog converter, and an interpolation filter.

20. A non-transitory machine readable storage medium including program code, when executed, to cause a machine to perform a method for predistorting an input signal of an amplifier device comprising:
- evaluating a selection criterion for a computational model of the amplifier device, the computational model providing an output signal of the amplifier device for the input signal of the amplifier device;
- selecting between a first computational model and a second computational model based on the evaluated selection criterion;
- generating a set of coefficients for the selected computational model, wherein generating a first set of coefficients for the first computational model requires a higher computational effort than generating a second set of coefficients for the second computational model; and
- predistorting the input signal using the selected computational model.

* * * * *